US012666666B2

(12) United States Patent
Chen et al.

(10) Patent No.: US 12,666,666 B2
(45) Date of Patent: Jun. 23, 2026

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Hong-Chih Chen, Changhua County (TW); Chun-Yi Chang, Hsinchu City (TW); Fu-Hsiang Su, Zhubei City (TW); Shih-Hsun Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 527 days.

(21) Appl. No.: 18/183,354

(22) Filed: Mar. 14, 2023

(65) Prior Publication Data

US 2024/0313047 A1     Sep. 19, 2024

(51) Int. Cl.
| | |
|---|---|
| *H10D 62/10* | (2025.01) |
| *H10D 30/01* | (2025.01) |
| *H10D 30/43* | (2025.01) |
| *H10D 30/67* | (2025.01) |
| *H10D 64/01* | (2025.01) |

(52) U.S. Cl.
CPC ......... *H10D 62/121* (2025.01); *H10D 30/014* (2025.01); *H10D 30/43* (2025.01); *H10D 30/6735* (2025.01); *H10D 30/6757* (2025.01); *H10D 64/017* (2025.01)

(58) Field of Classification Search
CPC .... H10D 62/121; H10D 30/014; H10D 30/43; H10D 30/6735; H10D 30/6757; H10D 64/017
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2021/0265508 | A1* | 8/2021 | Chiang ............... H10D 30/014 |

* cited by examiner

*Primary Examiner* — Mohammad A Rahman
(74) *Attorney, Agent, or Firm* — McClure, Qualey & Rodack, LLP

(57) ABSTRACT

A semiconductor device structure includes first nanostructures and second nanostructures formed over a substrate. The structure also includes gate structures that are wrapped around the first nanostructures and the second nanostructures and that extend along a first direction. The structure also includes a dielectric structure formed between two of the gate structures and parallel to the gate structures. A first sidewall of the first nanostructures is shifted from a first sidewall of the second nanostructures in a second direction, the second direction is different from the first direction.

20 Claims, 37 Drawing Sheets

10b

10a 134
130
132
128
124
126
116
136
138
114

Z
X
Y

10e

10g

10j

SEMICONDUCTOR DEVICE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes.

However, the integration of fabrication of the GAA features around the nanowire can be challenging. While the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2G-1, 2I-1, 2K-1, 2K-2, 2L-1 are cross-sectional representations of various stages of forming a semiconductor device structure, in accordance with some embodiments of the disclosure.

FIG. 12-1 is a cross-sectional representation of various stages of forming a semiconductor device structure, in accordance with some embodiments of the disclosure.

FIG. 13-1 is a cross-sectional representation of various stages of forming a semiconductor device structure, in accordance with some embodiments of the disclosure.

DETAILED DESCRIPTION

Figure 1:
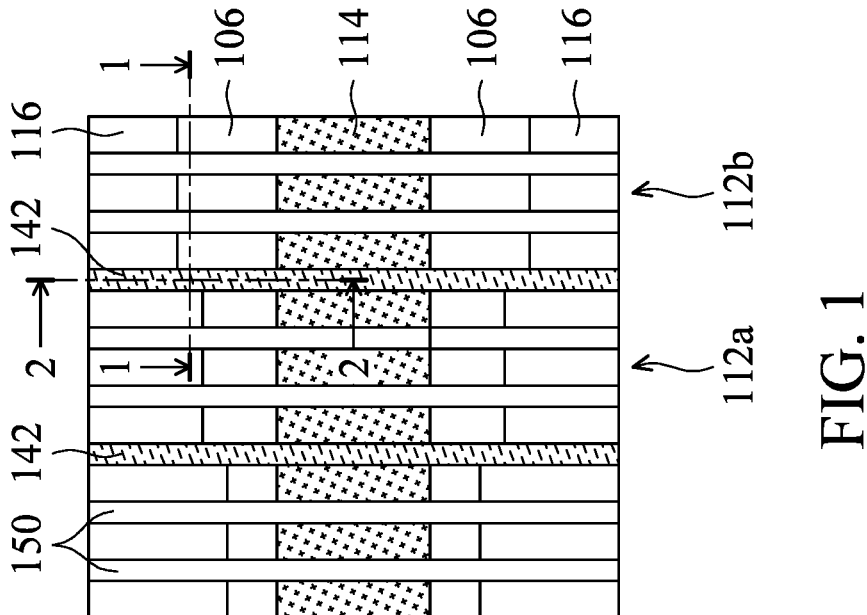
FIG. 1 is a top view of a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The nanostructure transistor (e.g. nanosheet transistor, nanowire transistor, multi-bridge channel, nano-ribbon FET, forksheet structures, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures.

Embodiments for forming a semiconductor device structure are provided. The method for forming the semiconductor device structure may include forming a dielectric structure between nanostructures with different widths. Therefore, the source/drain structures may not be damaged during removing the dummy gate material.

The semiconductor device structure may include various active devices. For example, the semiconductor device structure may include forksheet structures with channel structures attached with a wall structure. The semiconductor device structure may also include channel structures such as nanosheet structures. The semiconductor device structure may also include gate all around (GAA) structures, FinFET structures, or Si and SiGe planar transistors.

The semiconductor device structure 10a may be a nano-structure transistor. FIG. 1 is a top view of a semiconductor device structure 10a, in accordance with some embodiments of the disclosure. FIGS. 2A-2G, 2H-2I, 2J-2K, 2L, 2M-2N are perspective representations of various stages of forming a semiconductor device structure 10a, in accordance with some embodiments of the disclosure. FIGS. 2G-1, 2I-1, 2K-1, 2K-2, 2L-1 are cross-sectional representations of various stages of forming a semiconductor device structure 10a, in accordance with some embodiments of the disclosure. FIGS. 2G-1, 2I-1, 2K-1, 2L-1 show cross-sectional representations taken along line 1-1 in FIG. 1. FIGS. 2K-2 shows cross-sectional representations taken along line 2-2 in FIG. 1 respectively.

Figure 2A:
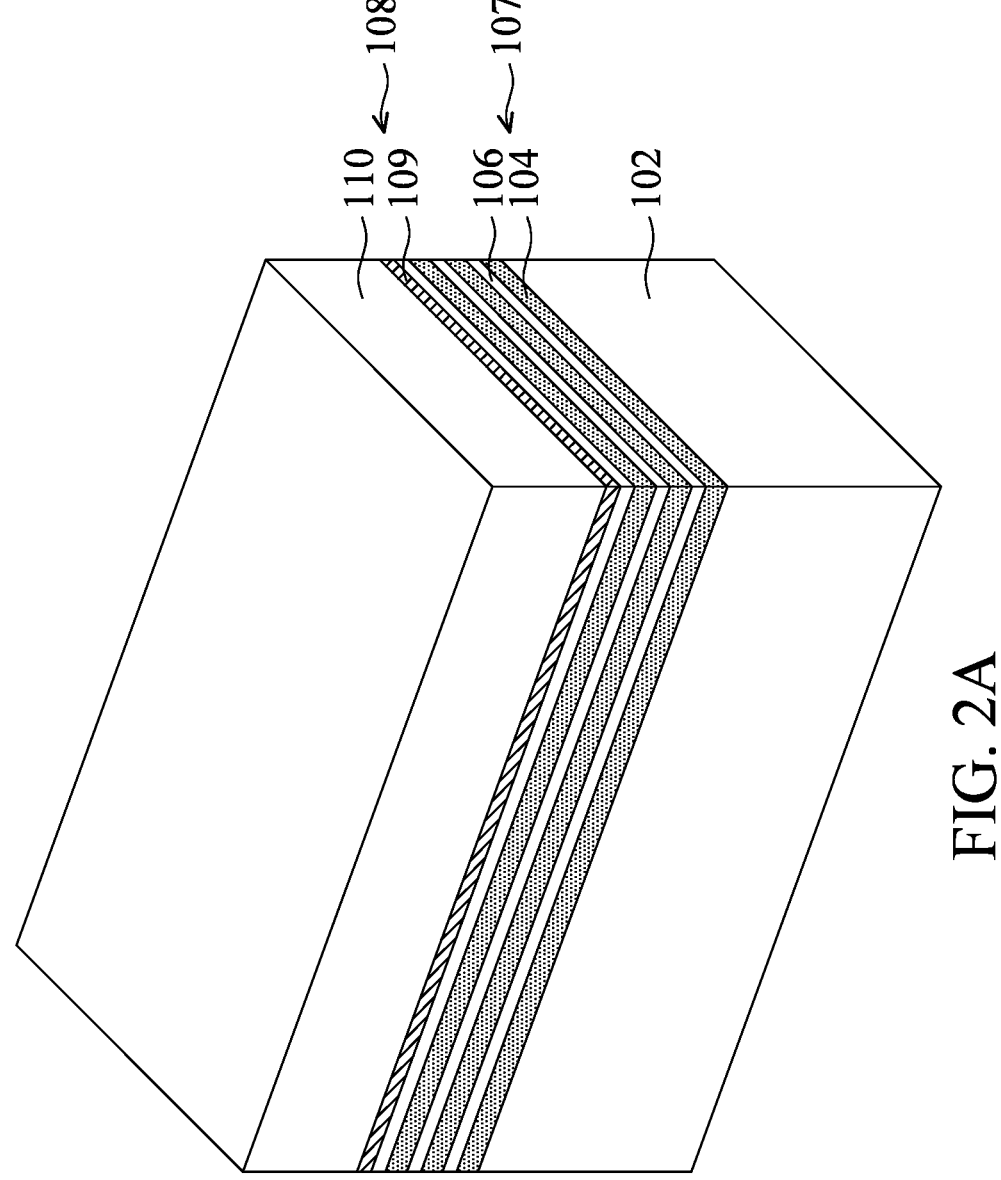
FIGS. 2A-2G, 2H-2I, 2J-2K, 2L, 2M-2N are perspective representations of various stages of forming a semiconductor device structure, in accordance with some embodiments of the disclosure.
Figure 2A:
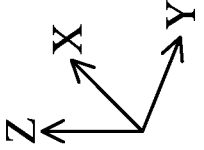

A semiconductor stack including first semiconductor material layers 104 and second semiconductor material layers 106 are formed over a substrate 102, as shown in FIG. 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, first semiconductor material layers 104 and second semiconductor material layers 106 are alternating stacked over the substrate 102 to form the semiconductor stack 107, as shown in FIG. 2A in accordance with some embodiments. The first semiconductor material layers 104 and the second semiconductor material layers 106 may include Si, Ge, SiGe, GaAs, InSb, GaP, GaSb, InAlAs, InGaAs, GaSbP, GaAsSb, or InP. The first semiconductor material layers 104 and second semiconductor material layers 106 may be made of different materials with different etching rates. In some embodiments, the first semiconductor material layers 104 are made of SiGe and the second semiconductor material layers 106 are made of Si.

The first semiconductor material layers 104 and second semiconductor material layers 106 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of the first semiconductor material layers 104 and three layers of the second semiconductor material layers 106 shown in FIGS. 2A, the number of the first semiconductor material layers 104 and second semiconductor material layers 106 are not limited herein, depending on the demand of performance and process. For example, the semiconductor structure may include two to five layers of the first semiconductor material layers 104 and two to five layers of the second semiconductor material layers 106.

Next, a mask structure 108 is formed over the semiconductor stack 107, as shown in FIG. 2A in accordance with some embodiments. The mask structure 108 may be a multilayer structure including a pad layer 109 and a hard mask layer 110 formed over the pad layer 109. The pad layer 109 may be made of silicon oxide, which may be formed by thermal oxidation or CVD. The hard mask layer 110 may be made of silicon nitride, which may be formed by CVD, such as LPCVD or plasma-enhanced CVD (PECVD).

Figure 2B:
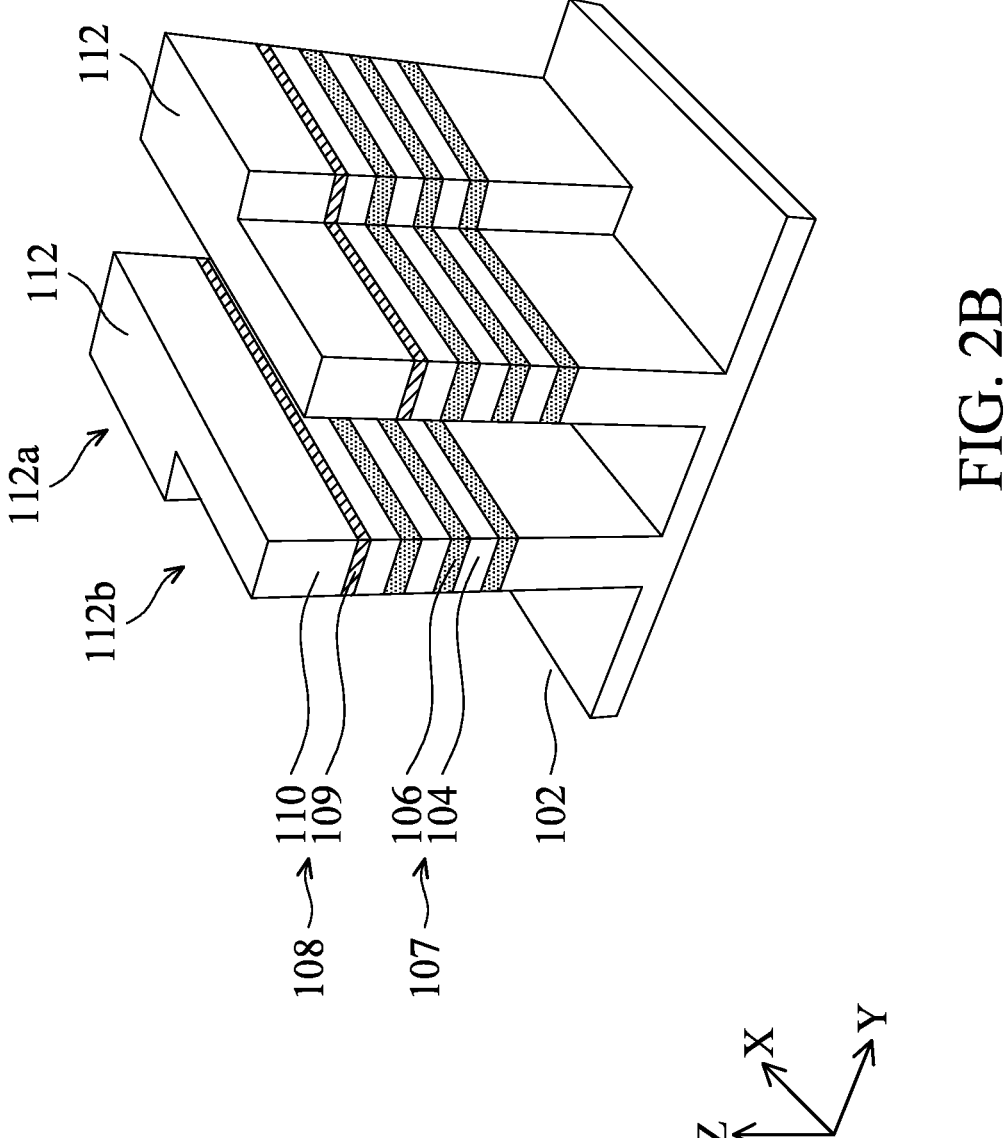

After the first semiconductor material layers 104 and the second semiconductor material layers 106 are formed as the semiconductor stack 107 over the substrate 102, the semiconductor stack 107 is patterned to form fin structures 112 using the mask structure 108 as a mask layer, as shown in FIG. 2B in accordance with some embodiments. The fin structures 112 may include base fin structures and the semiconductor stacks 107, including the first semiconductor material layers 104 and the second semiconductor material layers 106, formed over the base fin structure. The fin structure 112 may include the first region 112a and the second region 112b. In some embodiments, the first region 112a and the second region 112b of the fin structure 112 have different width. In some embodiments, the first region 112a of the fin structure 112 is wider than the second region 112b of the fin structure 112.

The patterning process may including forming a mask structure 108 over the first semiconductor material layers 104 and the second semiconductor material layers 106 and etching the semiconductor stack 107 and the underlying substrate 102 through the mask structure 108, as shown in FIG. 2B in accordance with some embodiments.

The patterning process of forming the fin structures 112 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

Figure 2C:
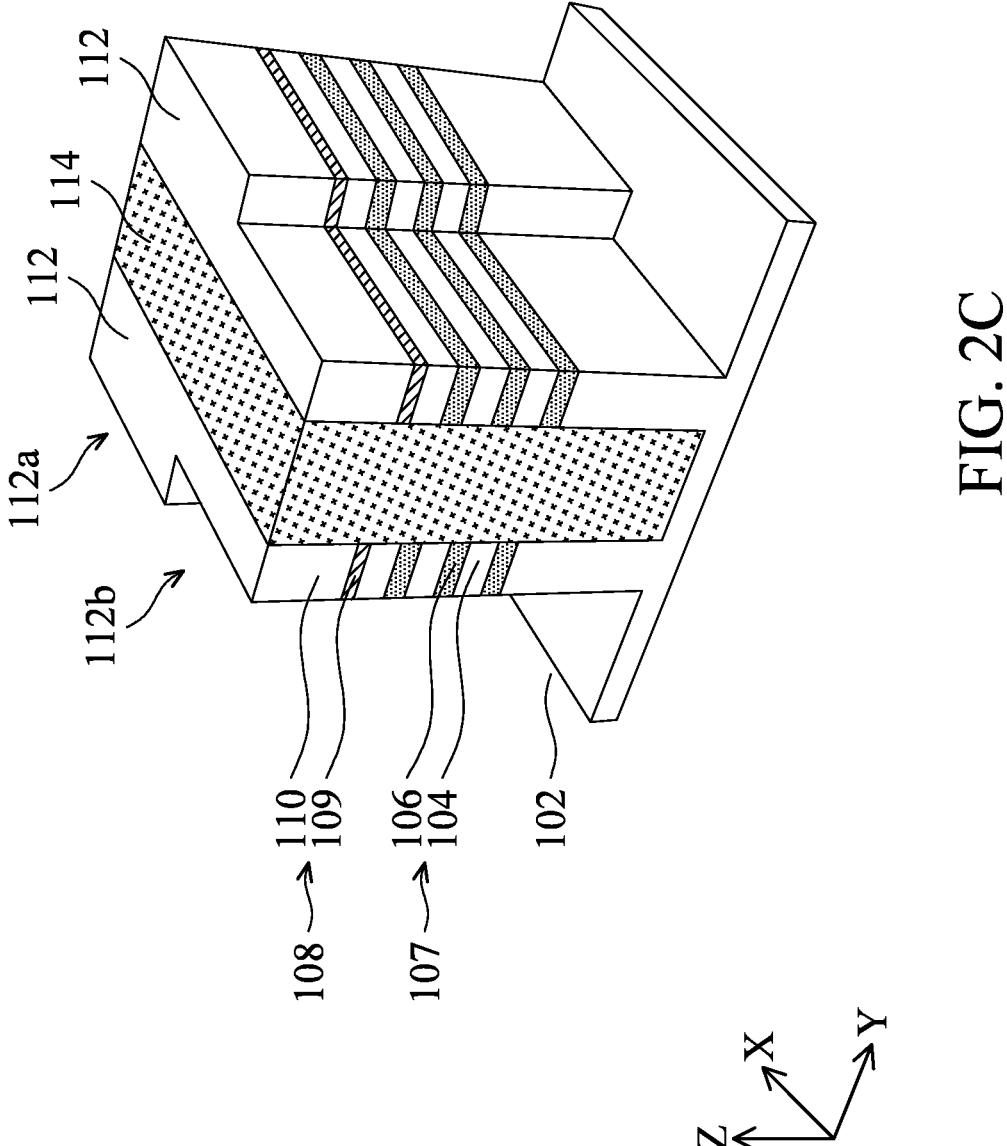

Afterwards, the wall structure material 114 may be conformally formed over the fin structures 112, and an etching process is performed to remove the wall structure material 114, and a wall structure 114 is formed between the fin structures 112, as shown in FIG. 2C in accordance with some embodiments.

The wall structure material 114 may be a multi-layer structure, including a liner layer, an etch stop layer formed over the liner layer, and a core dielectric layer formed over the etch stop layer. The liner layer may include SiN, SiCN, SiOC, SiOCN other suitable materials, or a combination thereof. The liner layer may be formed using CVD, ALD, other applicable methods, or a combination thereof. The etch stop layer may include silicon oxide. The liner layer may be formed using high-density plasma CVD (HDP-CVD), flowable CVD (FCVD), other applicable methods, or a combination thereof. The core dielectric layer may include SiN, SiCN, SiOC, SiOCN other suitable materials, or a combination thereof. The core dielectric layer may be formed using CVD, ALD, other applicable methods, or a combination thereof.

Afterwards, a planarization process such as a chemical mechanical polishing (CMP) process is performed to remove excess wall structure material 114, and a wall structure 114 is formed between the fin structures 112, as shown in FIG. 2C in accordance with some embodiments. After the planarization process, the top surface of the wall structure 114 may be level with the top surface of the hard mask layer 110 over the fin structures 112. The height of the wall structure 114 may be controlled by the planarization process. The wall structure 114 may provide isolation between subsequently formed nanostructures.

Figure 2D:
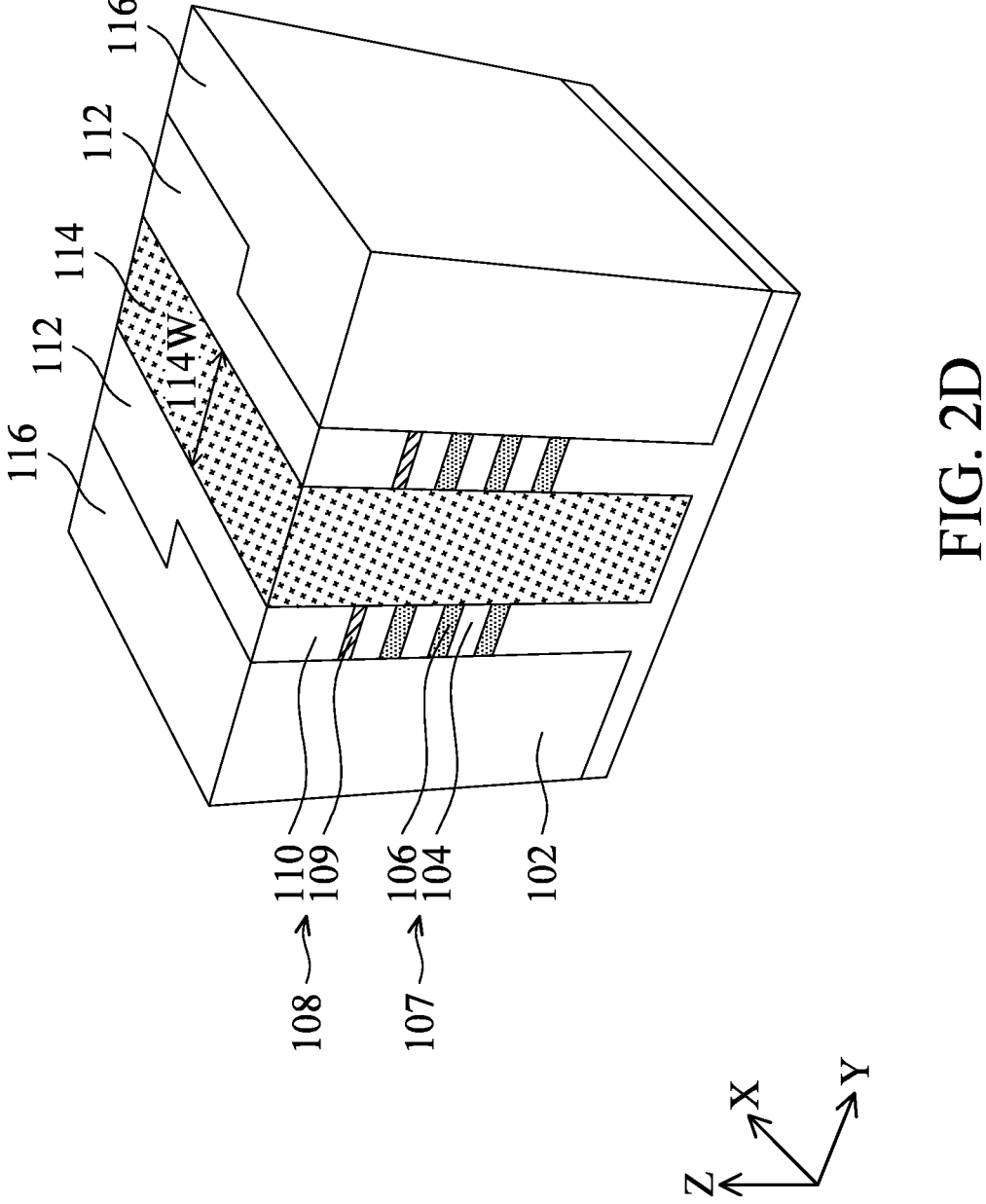

In some embodiments as shown in FIG. 2D, the wall structure 114 has a width 114W in a range of about 20 nm to about 25 nm. If the wall structure 114 is too narrow, it may be challenge for the etching process window and the loading effect may be worse. If the wall structure 114 is too wide, the device density may be decreased.

After the fin structures 112 are formed, a liner layer may be formed over the fin structures 112 and in the trenches between the fin structures 112. The liner layer may be conformally formed over the substrate 102, the fin structures 112, and the mask structure 108 covering the fin structures 112. The liner layer may be used to protect the fin structures 112 from being damaged in the following processes (such as an anneal process or an etching process). The liner layer may be made of silicon nitride. The liner layer may be formed by using thermal oxidation, a CVD process, an atomic layer deposition (ALD) process, an LPCVD process, a plasma enhanced CVD (PECVD) process, an HDPCVD process, a flowable CVD (FCVD) process, another applicable process, or a combination thereof.

Next, an isolation material 116 is then filled into the trenches between the fin structures 112 and over the liner layer, as shown in FIG. 2D in accordance with some embodiments. The isolation material 116 may be made of silicon oxide, silicon nitride, silicon oxynitride (SiON), fluoride-doped silicate glass (FSG), other low-k dielectric materials, or a combination thereof. The isolation material 116 may be deposited by a deposition process, such as a chemical vapor deposition (CVD) process (e.g. a flowable CVD (FCVD) process), a spin-on-glass process, or another applicable process.

Figure 2E:
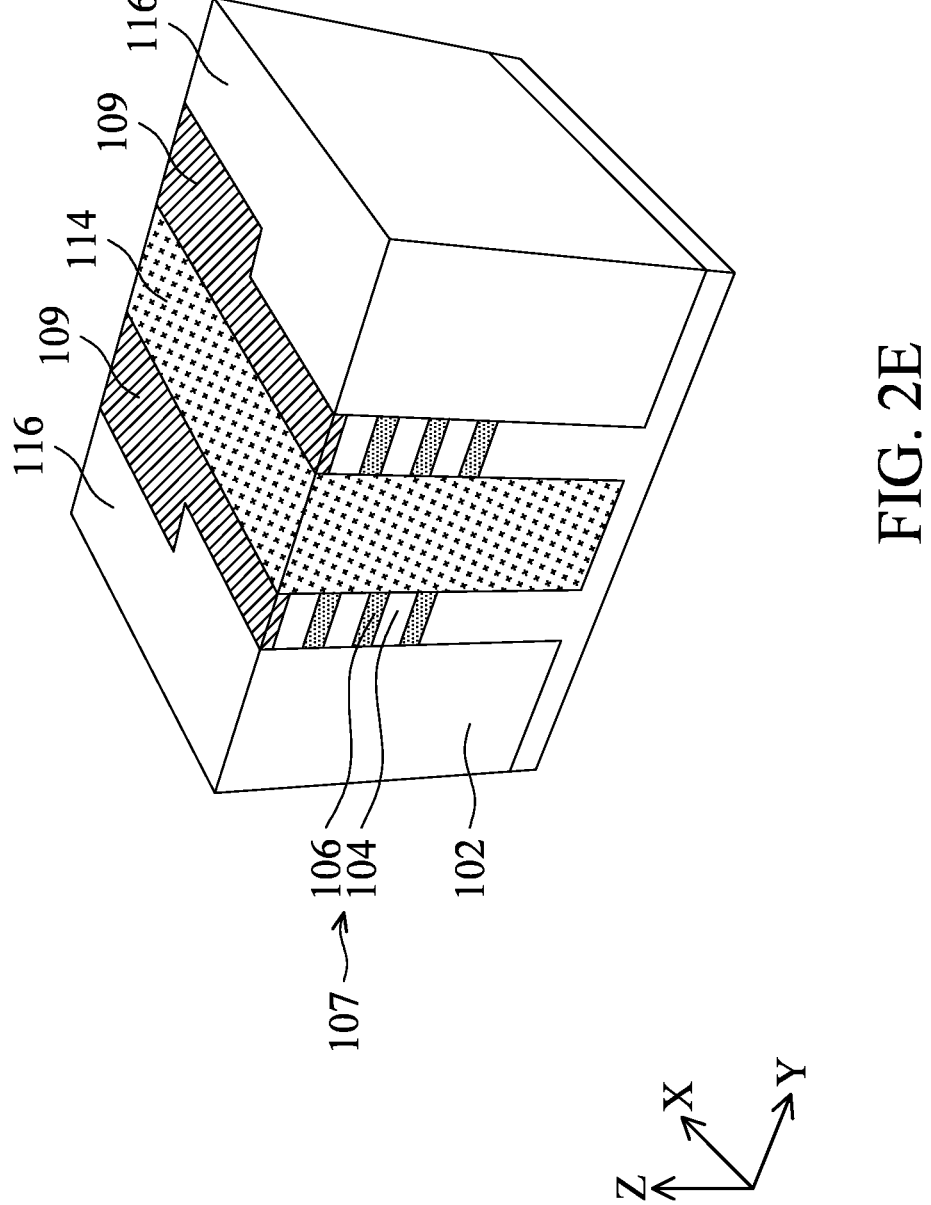

Next, the hard mask layer 110 over the fin structures 112 is removed, and the pad layer 109 over the fin structures 112 is exposed, as shown in FIG. 2E in accordance with some embodiments. The hard mask layer 110 may be removed by performing a planarization process such as a chemical mechanical polishing (CMP) process.

Figure 2F:
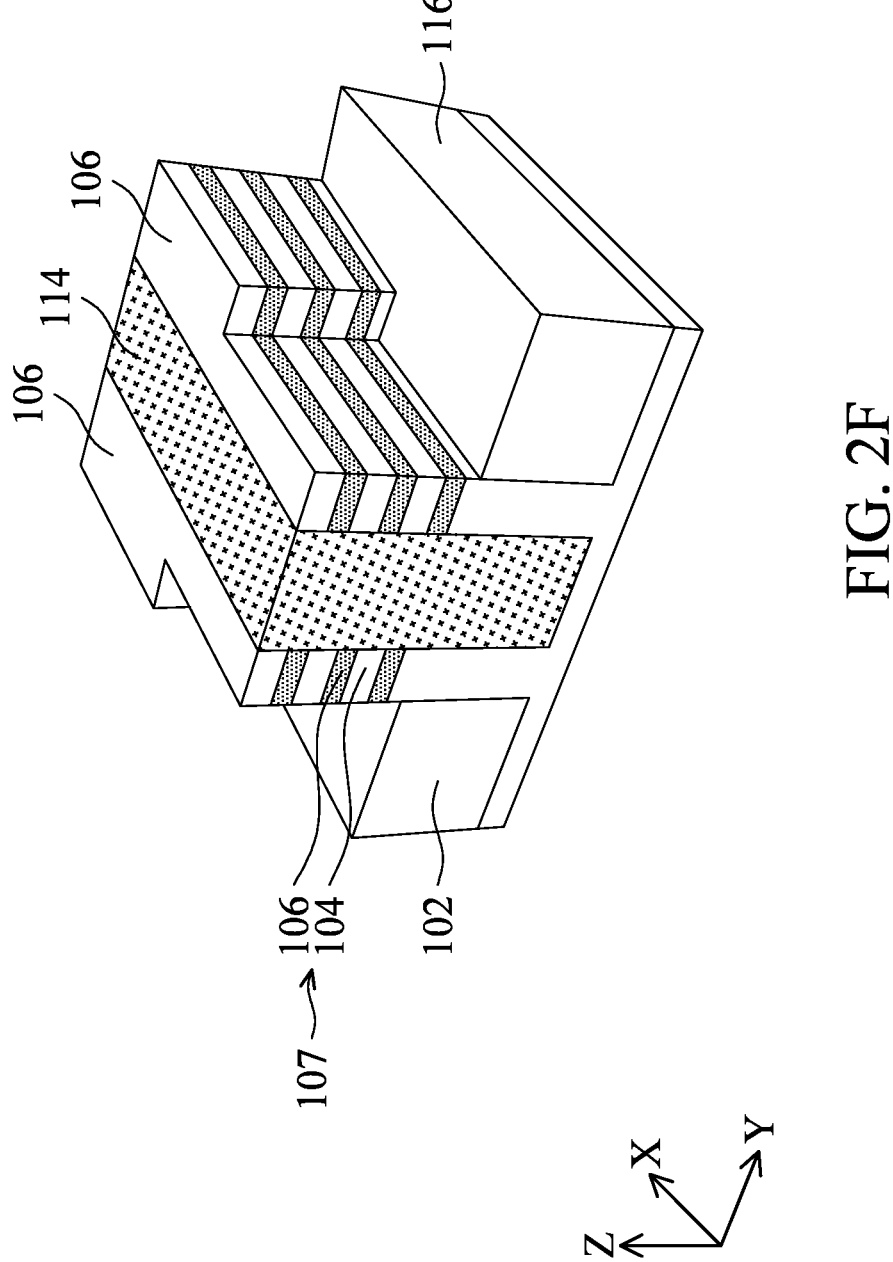

Next, the isolation material 116 is etched back using an etching process, and an isolation structure 116 is formed surrounding the base fin structure, as shown in FIG. 2F in accordance with some embodiments. The etching process may be used to remove the top portion of the isolation material 116. The pad layer 109 over the fin structure 112 may be removed in the etching process. As a result, the semiconductor stack 107 may be exposed. The isolation structure 116 may be a shallow trench isolation (STI) structure 116. The isolation structure 116 may be configured to electrically isolate active regions such as fin structures 112 of the semiconductor structure 10a and prevent electrical interference and crosstalk.

Figure 2G:
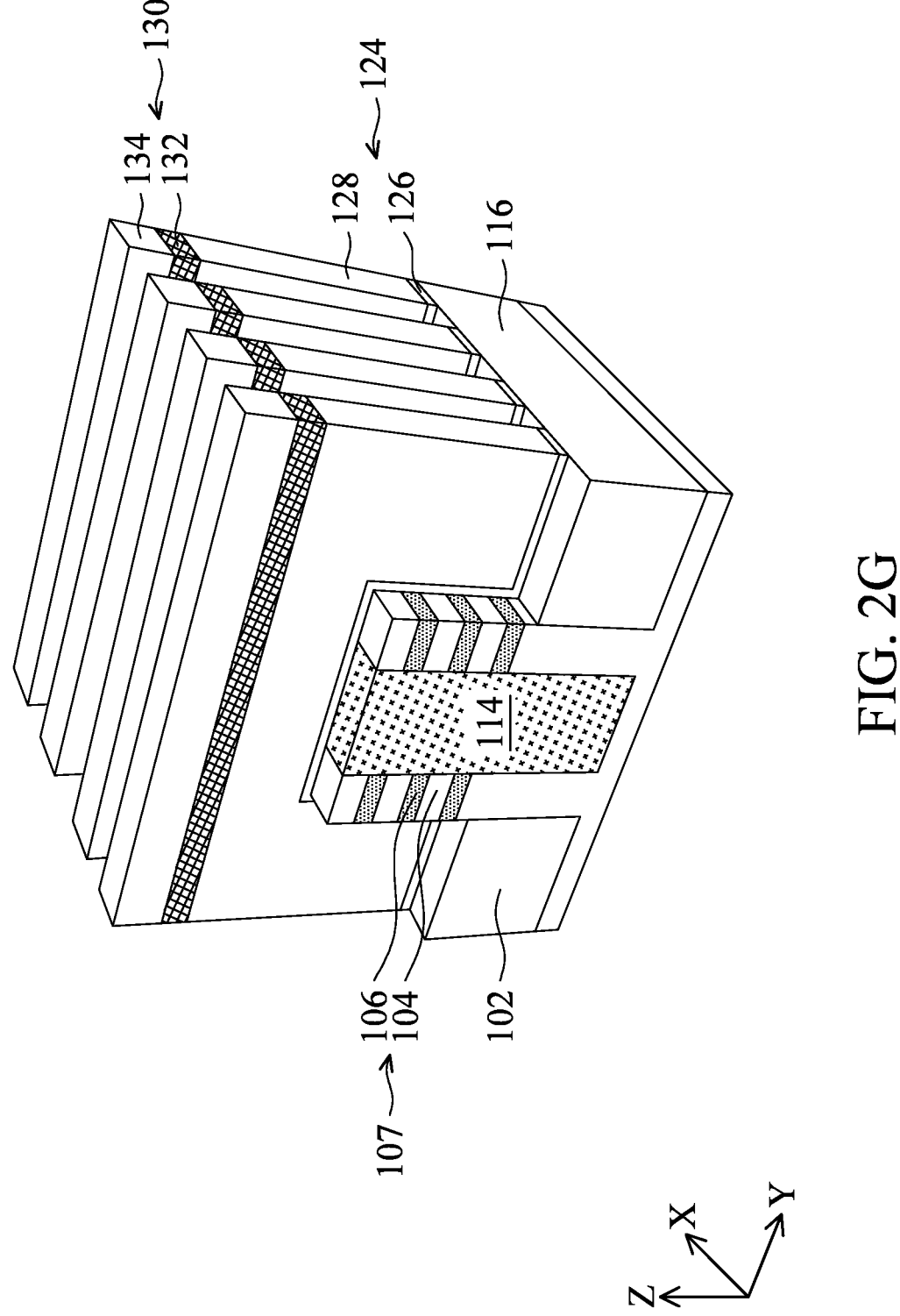
Figures 1, 2G:
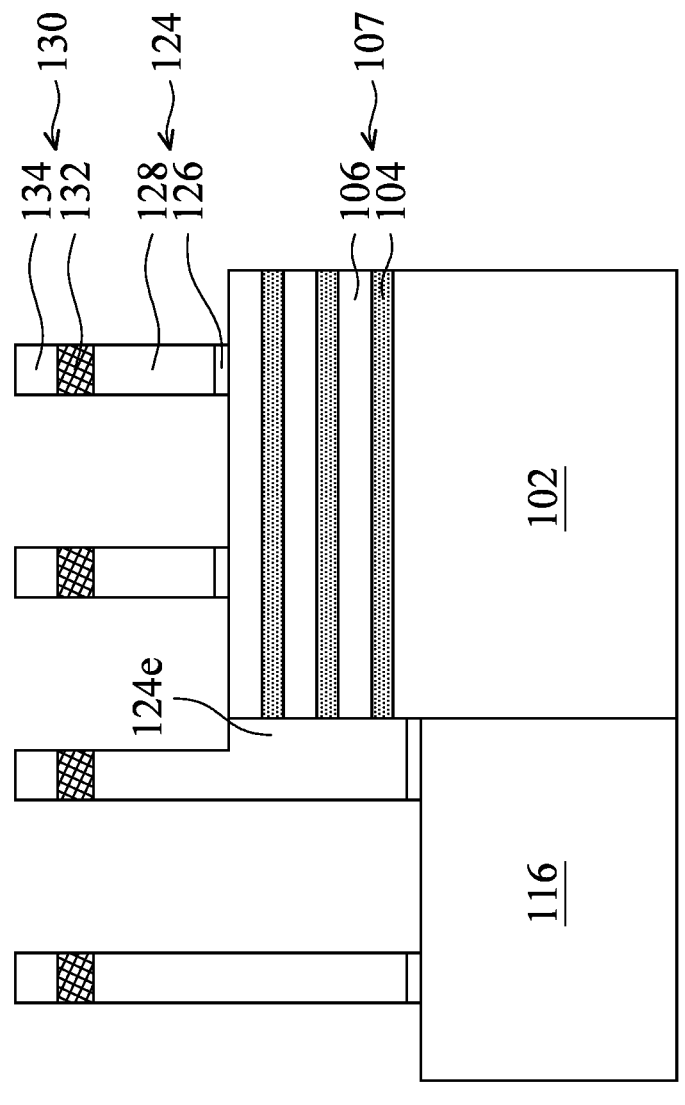

Next, a dummy gate structure 124 is formed over and across the fin structures 112, as shown in FIG. 2G in accordance with some embodiments. The dummy gate structure 124 may be used to define the source/drain regions and the channel regions of the resulting semiconductor structure 10a. The dummy gate structure 124 may include a dummy gate dielectric layer 126 and a dummy gate electrode layer 128. The dummy gate dielectric layer 126 and the dummy gate electrode layer 128 may be replaced by the following steps to form a real gate structure with a high-k dielectric layer and a metal gate electrode layer.

The dummy gate dielectric layer 126 may include one or more dielectric materials, such as silicon oxide, silicon nitride, silicon oxynitride (SiON), $HfO_2$, HfZrO, HfSiO, HfTiO, HfAlO, or a combination thereof. The dummy gate dielectric layer 126 may be formed by an oxidation process (e.g., a dry oxidation process, or a wet oxidation process), a chemical vapor deposition process, other applicable processes, or a combination thereof. Alternatively, the dummy gate dielectric layer 126 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, $BaZrO$, HfZrO, HfLaO, HfTaO, HfSiO, HfSiON, HfTiO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer 128 may include polycrystalline-silicon (poly-Si), poly-crystalline silicon-germanium (poly-SiGe), other applicable materials, or a combination thereof. The dummy gate electrode layer 128 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Next, the hard mask layers 130 are formed over the dummy gate structure 124, as shown in FIG. 2G in accordance with some embodiments. The hard mask layers 130 may include multiple layers, such as an oxide layer 132 and a nitride layer 134. In some embodiments, the oxide layer 132 includes silicon oxide, and the nitride layer 134 includes silicon nitride.

The formation of the dummy gate structure 124 may include conformally forming a dielectric material as the dummy gate dielectric layer 126. Afterwards, a conductive material may be formed over the dielectric material as the dummy gate electrode layer 128, and the bi-layered hard mask layers 130, including the oxide layer 132 and the nitride layer 134, may be formed over the conductive material. Next, the dielectric material and the conductive material may be patterned and etched through the bi-layered hard mask layers 130 to form the dummy gate structure 124, as shown in FIG. 2G in accordance with some embodiments. The dummy gate dielectric layer 126 and the dummy gate electrode layer 128 may be etched by a dry etching process. After the etching process, the first semiconductor material layers 104 and the second semiconductor material layers 106 may be exposed at opposite sides of the dummy gate structure 124.

In some embodiments as shown in FIG. 2G-1, since the dummy gate structure 124 is close to the semiconductor stack 107, the dummy gate material 124 may remain between the dummy gate structure 124 standing over the isolation structure 116 and the semiconductor stack 107, and an extending portion 124e of the dummy gate structure 124 may be formed between the dummy gate structure 124 and the semiconductor stack 107.

Next, a conformal dielectric layer is formed over the substrate 102 and the dummy gate structure 124, and then an etching process is performed. A pair of spacer layers 136 is formed over opposite sidewalls of the dummy gate structure 124, and a source/drain opening is formed beside the dummy gate structure 124, as shown in FIG. 2H in accordance with some embodiments.

The spacer layers 136 may be multi-layer structures formed by different materials with different etching selectivity. The spacer layers 136 may be made of silicon oxide, silicon nitride, silicon oxynitride, and/or dielectric materials. The spacer layers 136 may be formed by a chemical vapor deposition (CVD) process, a spin-on-glass process, or another applicable process.

Figure 2H:
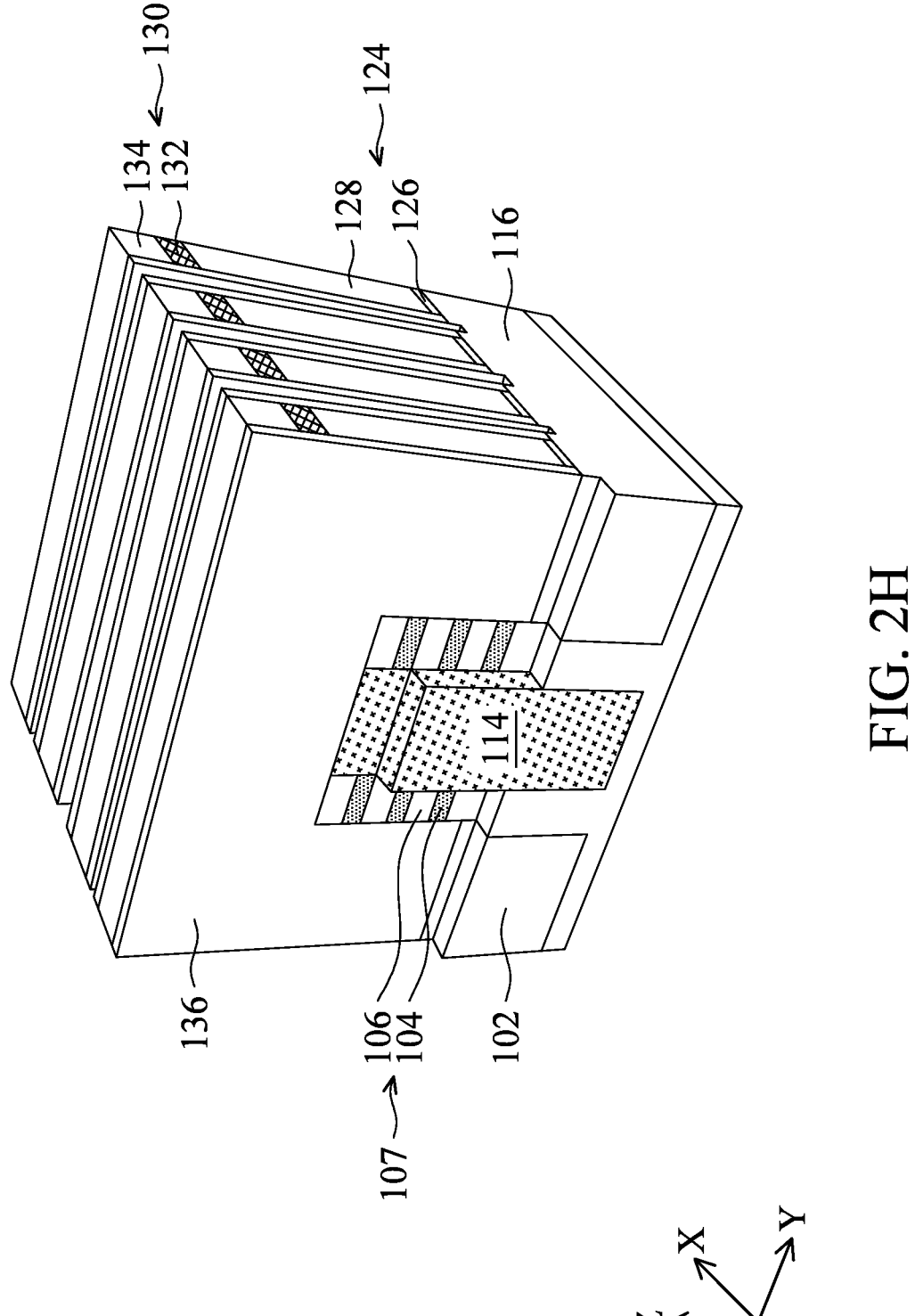

After the spacer layers 136 are formed, the first semiconductor material layers 104 and the second semiconductor material layers 106 of the fin structures 112 not covered by the dummy gate structure 124 and the spacer layers 136 are etched to form the trenches beside the dummy gate structure 124, as shown in FIG. 2H in accordance with some embodiments.

The fin structures 112 may be recessed by performing a number of etching processes. That is, the first semiconductor material layers 104 and the second semiconductor material layers 106 of the fin structures 112 may be etched in different etching processes. The etching process may be a dry etching process or a wet etching process. The fin structures 112 may be etched by a dry etching process. In some embodiments, the wall structure 114 and the isolation structure 116 is slightly recessed during the etching process.

Next, the first semiconductor material layers 104 may be laterally etched from the source/drain opening to form recesses. The outer portions of the first semiconductor material layers 104 may be removed, and the inner portions of the first semiconductor material layers 104 under the dummy gate structure 124 and the spacer layers 136 may remain. After the lateral etching process, the sidewalls of the etched first semiconductor material layers 104 may be not aligned with the sidewalls of the second semiconductor material layers 106.

The lateral etching of the first semiconductor material layers 104 may be a dry etching process, a wet etching process, or a combination thereof. In some embodiments, the first semiconductor material layers 104 are Ge or SiGe and the second semiconductor material layers 106 are Si, and the first semiconductor material layers 104 are selectively etched to form the recesses by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions, or the like.

Figure 2I:
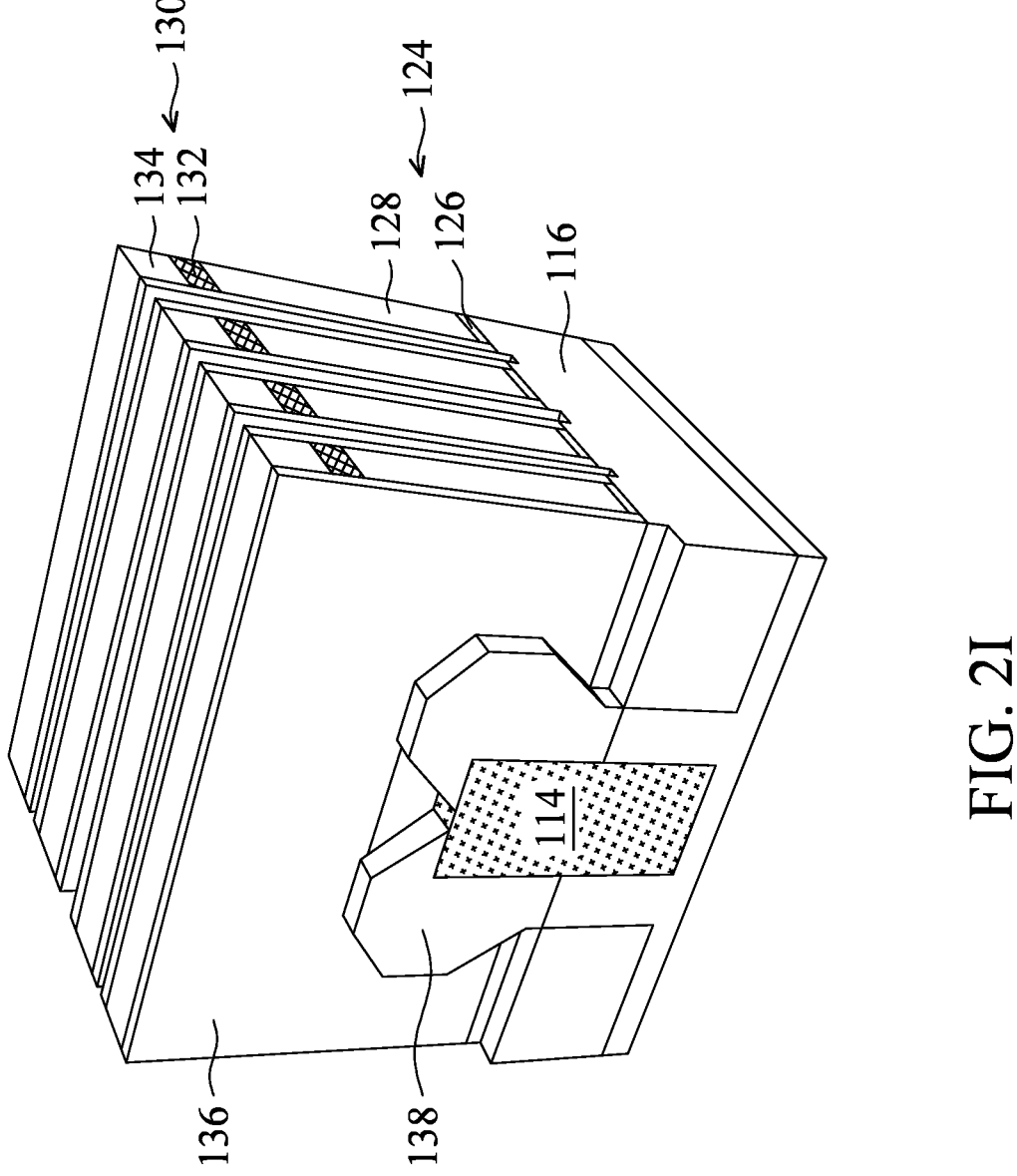
Figure 2I:
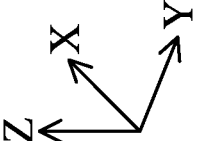
Figures 1, 2I:
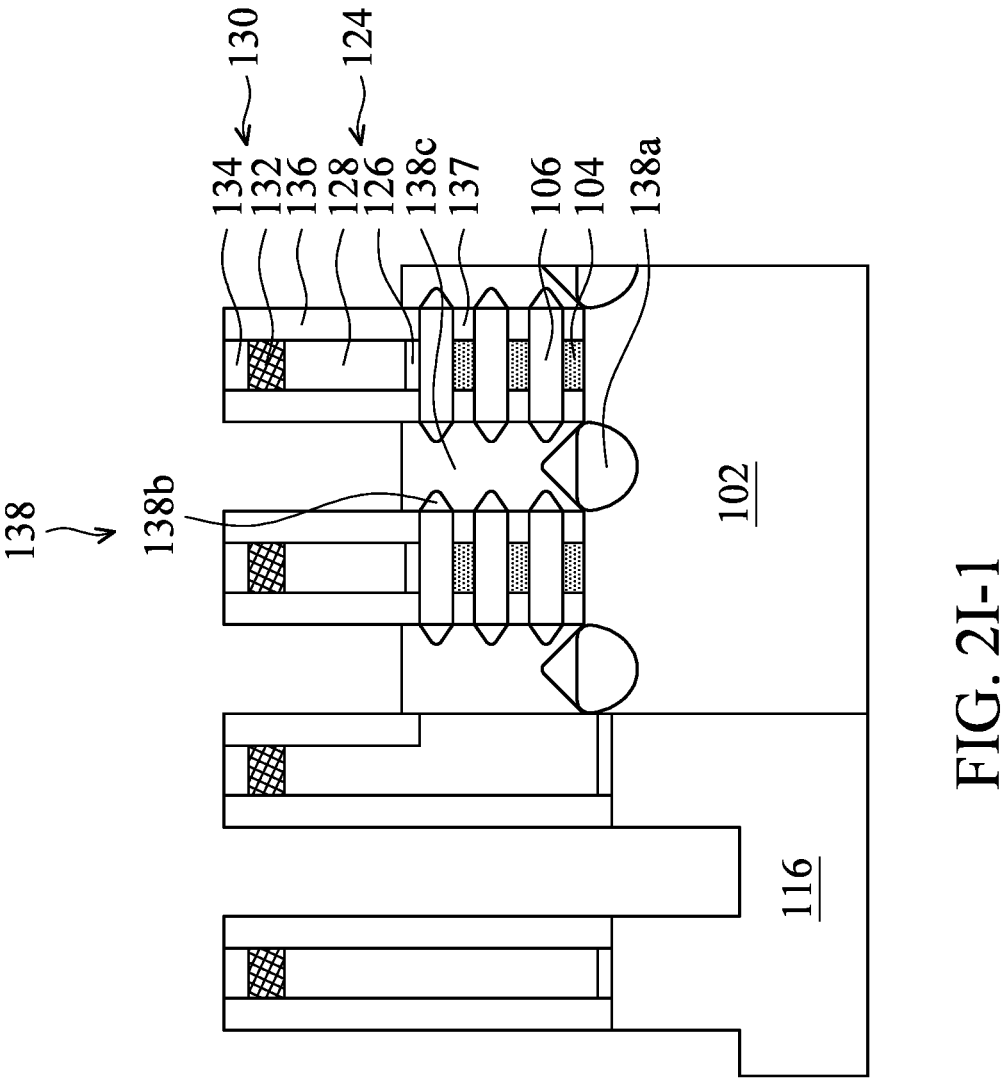

Next, an inner spacer 137 may be formed in the recess, as shown in FIG. 2I-1 in accordance with some embodiments. The inner spacer 137 may provide a barrier between subsequently formed source/drain epitaxial structures and gate structure. The inner spacer 137 may be made of dielectric material such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. The inner spacer 137 may be formed using a deposition process. The deposition process may include a CVD process (such as LPCVD, PECVD, SACVD, or FCVD), an ALD process, another applicable method, or a combination thereof.

Next, a source/drain epitaxial structure 138 is formed in the source/drain opening, as shown in FIGS. 2I and 2I-1 in accordance with some embodiments. The source/drain epitaxial structure 138 may be formed over opposite sides of the dummy gate structure 124. Source/drain epitaxial structures 138 may refer to a source or a drain, individually or collectively dependent upon the context.

A strained material may be grown in the source/drain opening using an epitaxial (epi) process to form the source/drain epitaxial structure 138. In addition, the lattice constant of the strained material may be different from the lattice constant of the substrate 102. The source/drain epitaxial structure 138 may include SiGeB, SiP, SiAs, SiGe, other applicable materials, or a combination thereof. The source/drain epitaxial structure 138 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (CI-VPE), or any other suitable method.

The source/drain epitaxial structure 138 may be in-situ doped during the epitaxial growth process. For example, the source/drain epitaxial structures 138 may be the epitaxially grown SiGe doped with boron (B). For example, the source/drain epitaxial structure 138 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. The source/drain epitaxial structure 138 may be doped in one or more implantation processes after the epitaxial growth process.

The source/drain epitaxial structure 138 may include a first portion 138a formed at the bottom of the source/drain opening, a second portion 138b formed over the first portion 138a and the sidewall of the second semiconductor material layers 106, and a third portion 138c filled over the second portion 138b in the source/drain opening. The first portion 138a may be made of dielectric material such as silicon nitride, silicon oxide, silicon oxynitride (SiON), other applicable materials, or a combination thereof. The first portion 138a also may be made of un-doped or lower doped Si, SiGe, or SiP. The second portion 138b and the third portion 138c may be doped SiGe or SiP. In some embodiments, the dopant concentration of the third portion 138c is higher than the dopant concentration of the second portion 138b, and the dopant concentration of the second portion 138b is higher than the dopant concentration of the first portion 138a. Therefore, dopant out-diffusing issue may be prevented.

Next, a contact etch stop layer 139 may be formed over the source/drain epitaxial structure 138. More specifically, the contact etch stop layer 139 may cover the sidewalls of the spacer layers 136 and the source/drain epitaxial structures 138. The contact etch stop layer 139 may be made of a dielectric material such as silicon nitride, silicon oxide, silicon oxynitride (SiON), other applicable materials, or a combination thereof. The contact etch stop layer 139 may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

Figure 2J:
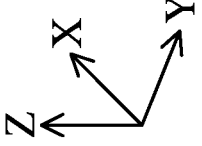
Figure 2K:
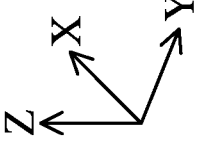
Figures 1, 2K:
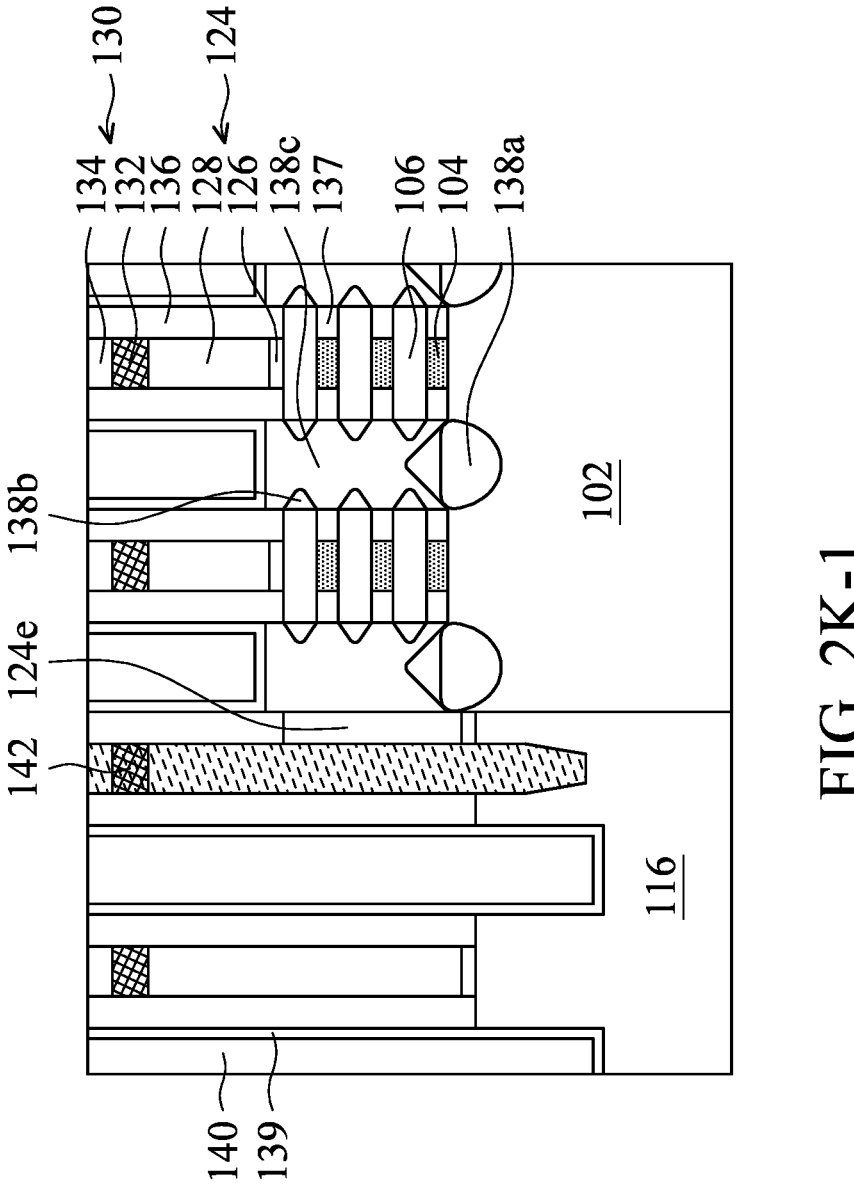
Figures 2, 2K:
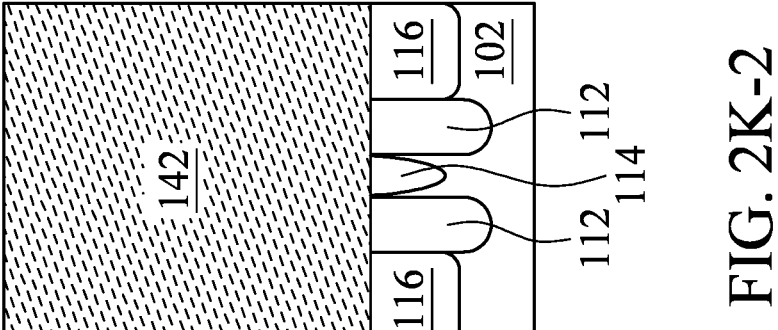

After the contact etch stop layer 139 is formed, an inter-layer dielectric (ILD) structure 140 is formed over the source/drain epitaxial structure 138, as shown in FIG. 2J in accordance with some embodiments. The ILD structure 140 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or another applicable dielectric material. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 140 may be formed by chemical vapor deposition (CVD), physical vapor deposition (PVD), atomic layer deposition (ALD), spin-on coating, or another applicable process.

Afterwards, a planarizing process or an etch-back process may be performed on the ILD structure 140 until the top surface of the dummy gate structure 124 is exposed. After the planarizing process, the top surface of the dummy gate structure 124 may be substantially level with the top surfaces of the spacer layers 136 and the ILD structure 140. The planarizing process may include a grinding process, a chemical mechanical polishing (CMP) process, an etching process, other applicable processes, or a combination thereof.

Next, one of the dummy gate structures 124 adjacent the boundary between the first region 112a and the second region 112b of the fin structure is removed, and an opening may be formed. In some embodiments, the wall structure 114, the semiconductor stacks 107, and the isolation structure 116 may be also partially removed. Later, a dielectric structure 142 is formed in the opening, as shown in FIGS. 2K, 2K-1, 2K-2 in accordance with some embodiments.

The dummy gate structure 124 near the boundary between the first region 112a and the second region 112b of the fin structure may be removed by patterning process such as a photolithography and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

In some embodiments, the extending portion 124e of the dummy gate structure 124 remains after removing the dummy gate structure 124 near the boundary between the first region 112a and the second region 112b of the fin structure 112. In some embodiments, the extending portion 124e of the dummy gate structure 124 is formed between the source/drain epitaxial structures 138 and the dielectric structure 142.

In some embodiments, the dielectric structure 142 is made of a single or a multi-layer material including $SiO_2$, SiCO, SiO2:F, SiN, SiCN, oxide, nitrogen, and carbon base content materials. In some embodiments, the dielectric structure 142 includes oxides and nitrides. In some embodiments, the dielectric structure 142 includes oxides and low dielectric constant materials. The dielectric structure 142 may include a hard shell dielectric layer made of high dielectric constant materials such as SiN. The hard shell layer may prevent the dielectric structure 142 from being damaged in the following etching processes. The dielectric structure 142 may be formed by CVD, PVD, ALD, spin-on coating, or another applicable process.

In some embodiments, the dielectric structure 142 protrudes in the isolation structure 116. In some embodiments, the bottom surface of the dielectric structure 142 is lower than the bottom surface of the source/drain epitaxial structures 138. In some embodiments, a portion of the dielectric structure 142 is between the source/drain structures 138 and the interlayer dielectric structure 140.

Figure 2L:
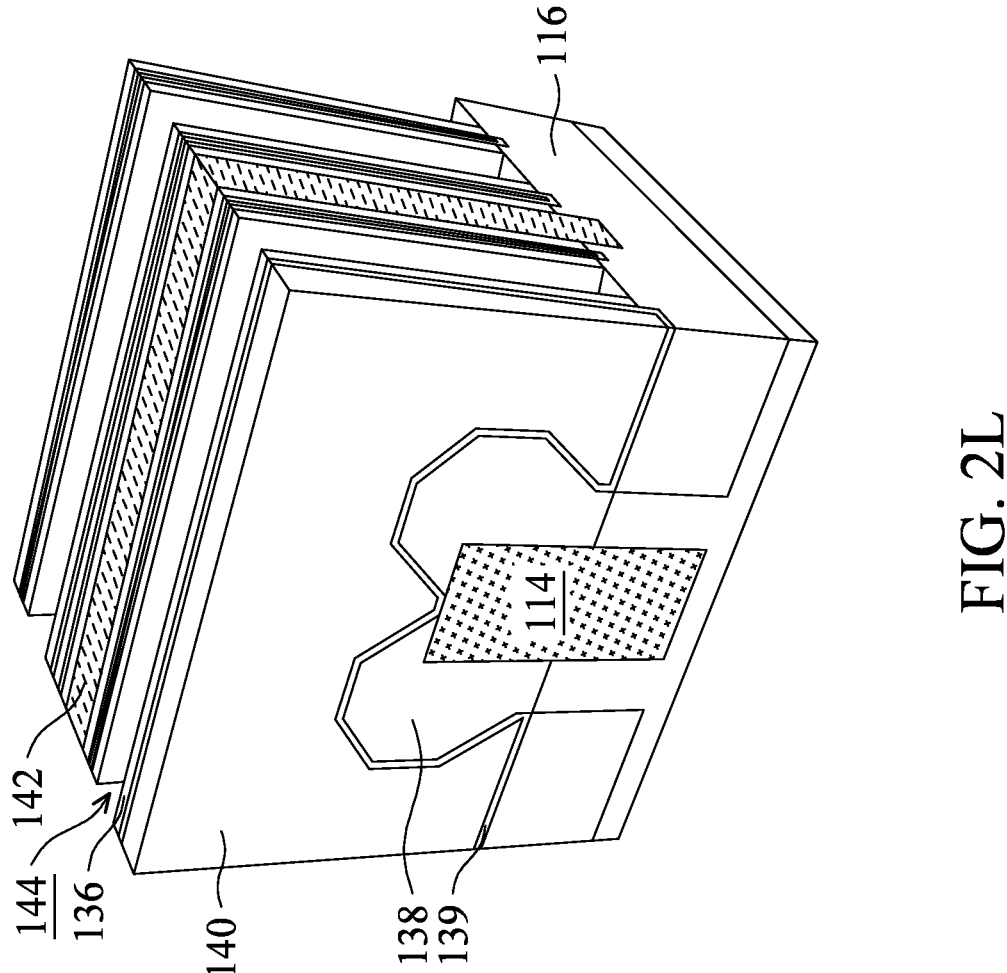
Figure 2L:
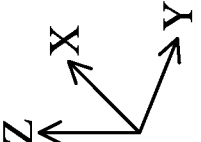
Figures 1, 2L:
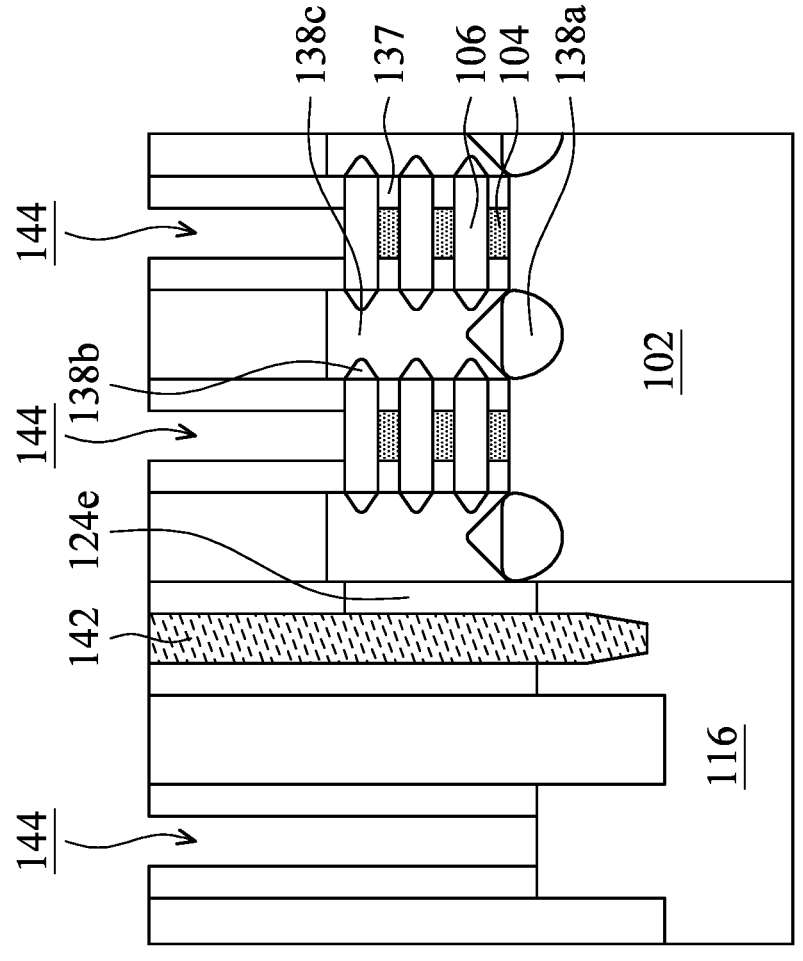

Next, the dummy gate structure 124 is removed, as shown in FIGS. 2L and 2L-1 in accordance with some embodiments. Therefore, a trench 144 is formed between the spacer layers 136 over the fin structures 112 and the second semiconductor material layers 106 are exposed from the trench 144. The trench 144 may be also formed over the isolation structures 116.

The dummy gate structure 124 may be removed by a dry etching process or a wet etching process. The removal process may include one or more etching processes. For example, when the dummy gate electrode layer 128 are polysilicon, a wet etchant such as a tetramethylammonium hydroxide (TMAH) solution may be used to selectively remove the dummy gate electrode layer 128. Afterwards, the dummy gate dielectric layer 126 may be removed using a plasma dry etching, a dry chemical etching, and/or a wet etching.

Since the dielectric structure 142 is sandwiched between the first region 112a and the second region 112b of the fin structures 122 with different widths, and the dielectric structure 142 may not be etched when removing the dummy gate structure 124, the adjacent source/drain structures 138 may be protected by the dielectric structure 142, and the source/drain structures 138 may not be etched when removing the dummy gate structure 124. Therefore, the source/drain structures 138 may not be damaged, and the production yield may be improved.

Figure 2M:
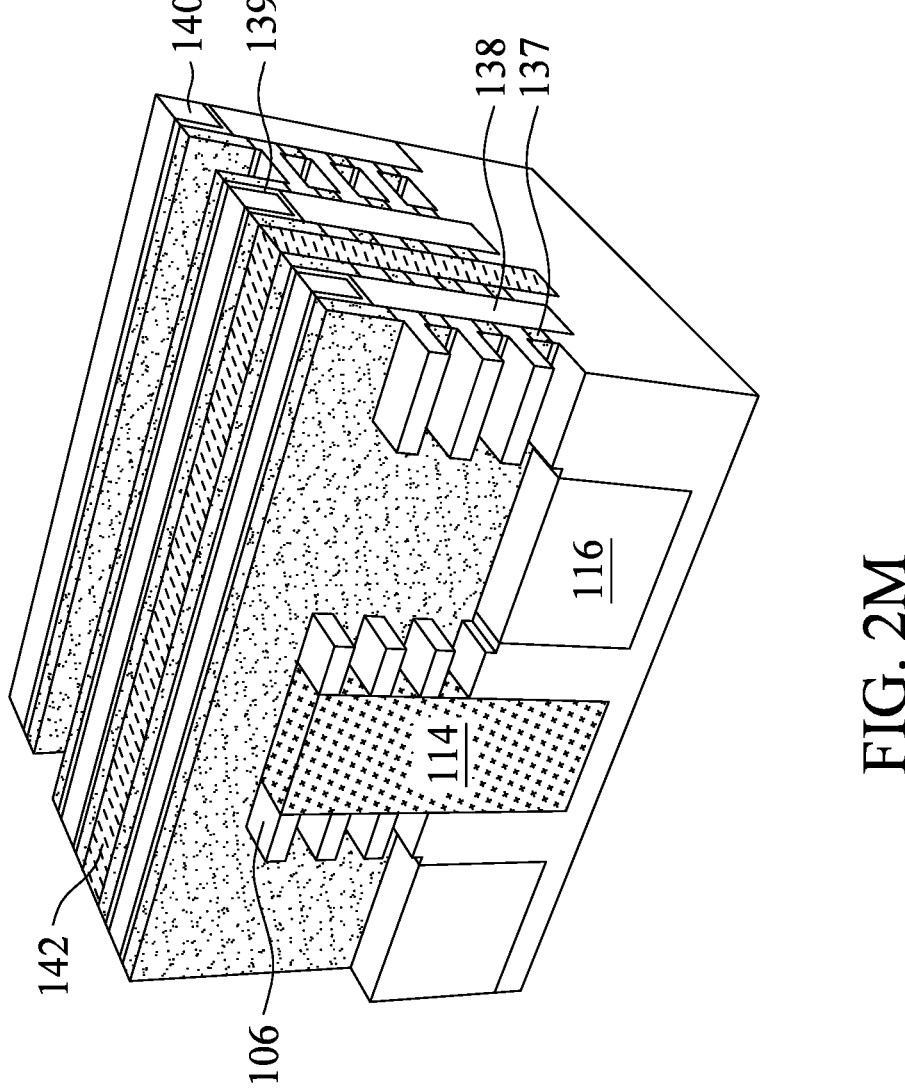
Figure 2M:
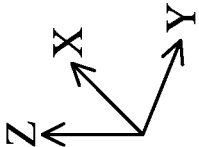
Figure 2N:
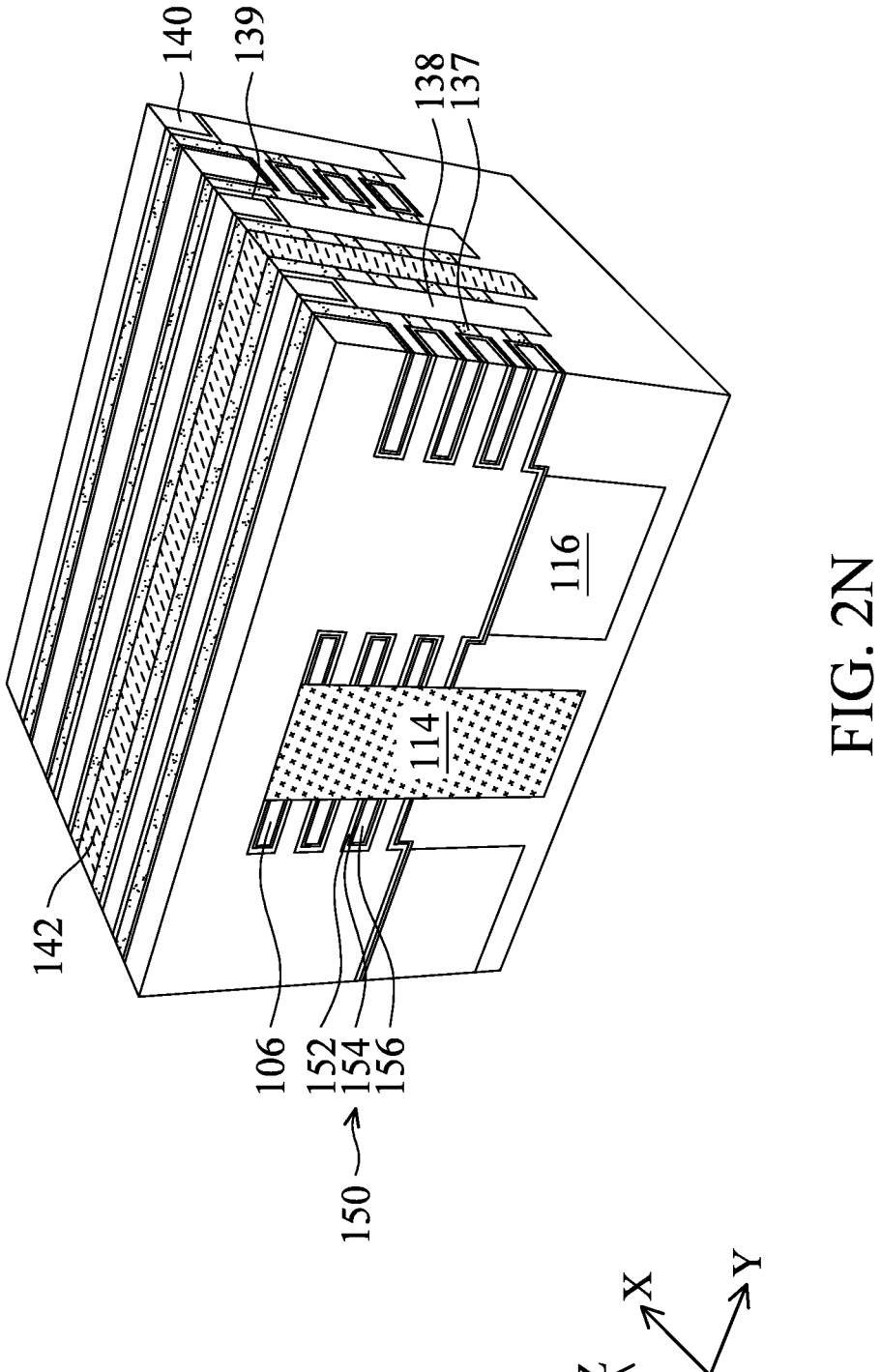

FIGS. 2M and 2N show perspective representations of with cross-sectional representations of the semiconductor stacks 107 in the following stages of forming a semiconductor device structure 10a.

Next, the first semiconductor material layers 104 are removed and gaps are formed between the first semiconductor material layers 104, as shown in FIG. 2M in accordance with some embodiments. More specifically, the second semiconductor material layers 106 exposed by the gaps form nanostructures 106, and the nanostructures 106 are configured to function as channel regions 106 in the resulting semiconductor devices 10a in accordance with some embodiments.

The first semiconductor material layers 104 may be removed by performing one or more etching processes. The etching process may include a selective wet etching process, such as APM (e.g., ammonia hydroxide-hydrogen peroxide-water mixture) etching process. The wet etching process uses etchants such as ammonium hydroxide ($NH_4OH$), TMAH, ethylenediamine pyrocatechol (EDP), and/or potassium hydroxide (KOH) solutions.

Next, gate structures 150 are formed surrounding the nanostructures 106 and over the nanostructures 106, as shown in FIG. 2N in accordance with some embodiments. Gate structures 150 are formed surrounding the nanostructures 106 to form gate-all-around (GAA) transistor structures. Therefore, the gate control ability may be enhanced.

In some embodiments as shown in FIG. 2N, the gate structures 150 are multi-layered structures. Each of the gate structures 150 may include an interfacial layer 152, a gate dielectric layer 154, a work function layer 156, and a gate electrode layer.

The interfacial layer 152 may be formed around the nanostructures 106 and on the exposed portions of the base fin structures. The interfacial layer 152 may be made of silicon oxide, and the interfacial layer 152 may be formed by thermal oxidation.

The gate dielectric layer 154 is formed over the interfacial layer 152, so that the nanostructures 106 are surrounded (e.g. wrapped) by the gate dielectric layer 154. In addition, the gate dielectric layer 154 also covers the sidewalls of the spacer layers 136 and the inner spacers 137 in accordance with some embodiments. The gate dielectric layer 154 may be made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—Al2O3) alloy, other applicable high-k dielectric materials, or a combination thereof. The gate dielectric layer 154 may be formed using CVD, ALD, other applicable methods, or a combination thereof.

Next, the work function layer 156 is conformally formed over the gate dielectric layer 154, as shown in FIG. 2N in accordance with some embodiments. The work function layer 156 may be made of a metal material. The metal material of the work function layer 156 may include an N-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. The work function layer 156 may be formed by using CVD, ALD, other applicable methods, or a combination thereof.

The metal material of the work function layer 156 may include a P-work-function metal. The P-work-function metal may include titanium nitride (TiN), tungsten nitride (WN), tantalum nitride (TaN), ruthenium (Ru) or a combination thereof. The work function layer 156 may be formed by using CVD, ALD, other applicable methods, or a combination thereof.

Next, a gate electrode layer may be formed over the work function layer 156. The gate electrode layer may be made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. The gate electrode layer may be formed using CVD, ALD, electroplating, another applicable method, or a combination thereof. After the gate electrode layer is formed, a planarization process such as CMP or an etch-back process may be performed.

With a dielectric structure 142 formed between the first region 112a and the second region 112b of the fin structure 112 with different widths, the source/drain structures 138 formed at the boundary between the first region 112a and the second region 112b of the fin structure 112 may not be damaged. Therefore, the production yield may be improved.

Figure 3:
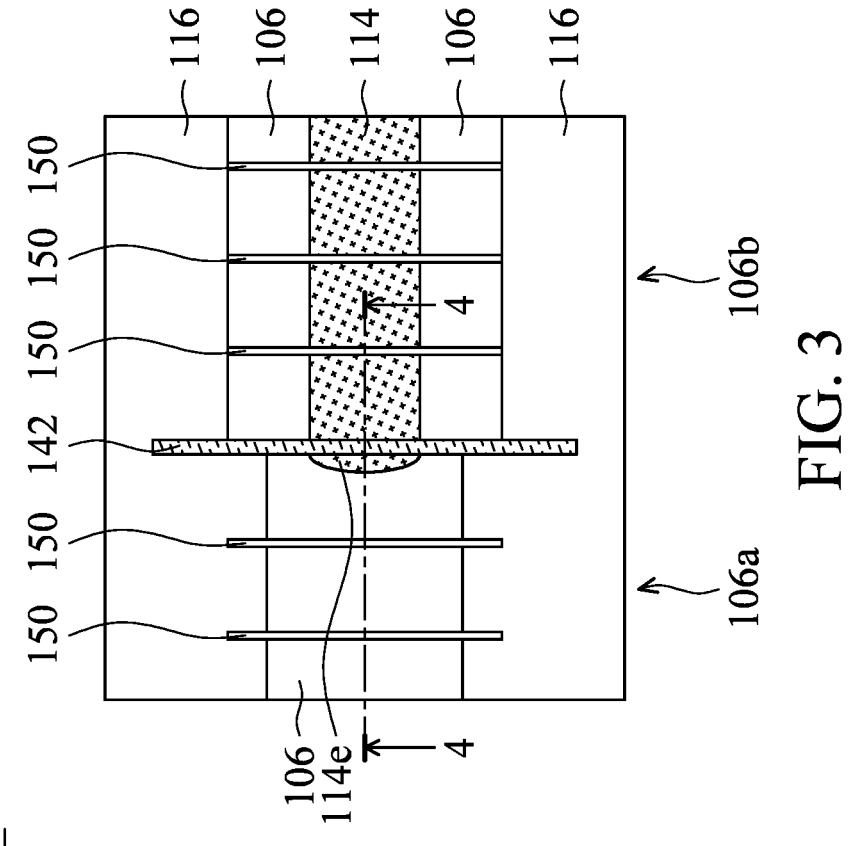
FIG. 3 is a top view of a semiconductor device structure, in accordance with some embodiments of the disclosure.

Many variations and/or modifications may be made to the embodiments of the disclosure. FIG. 3 is a top view of a semiconductor device structure 10b, in accordance with some embodiments of the disclosure. FIGS. 4A-4D are cross-sectional representations of various stages of forming a semiconductor device structure 10b. Some processes or devices are the same as, or similar to, those described in the embodiments above, and therefore the descriptions of these processes and devices are not repeated herein. The difference from the embodiments described above is that, as shown in FIG. 3 in accordance with some embodiments, the dielectric structure 142 may be formed between the nanosheet structures 106a and the forksheet structures 106b.

In some embodiments as shown in FIG. 3, the wall structure 114 has an extending portion 114e protruding from the sidewall of the dielectric structure 142. The extending portion 114e of the wall structure 114 may prevent the wall structure 114 dented from the dielectric structure 142. Therefore, the wall structure 114 may provide better isolation between the channel regions of the forksheet structures 106b.

Figure 4A:
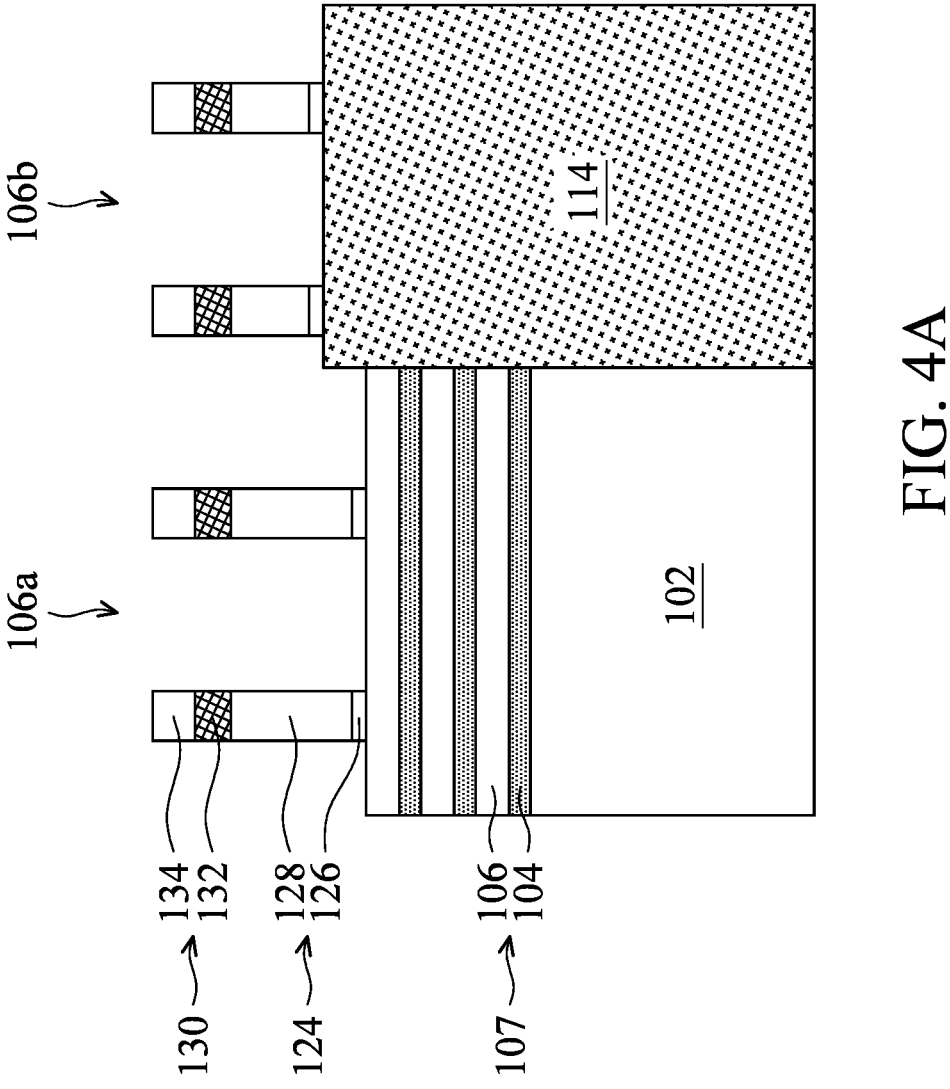
FIGS. 4A-4D are cross-sectional representations of various stages of forming a semiconductor device structure, in accordance with some embodiments of the disclosure.
Figure 4B:
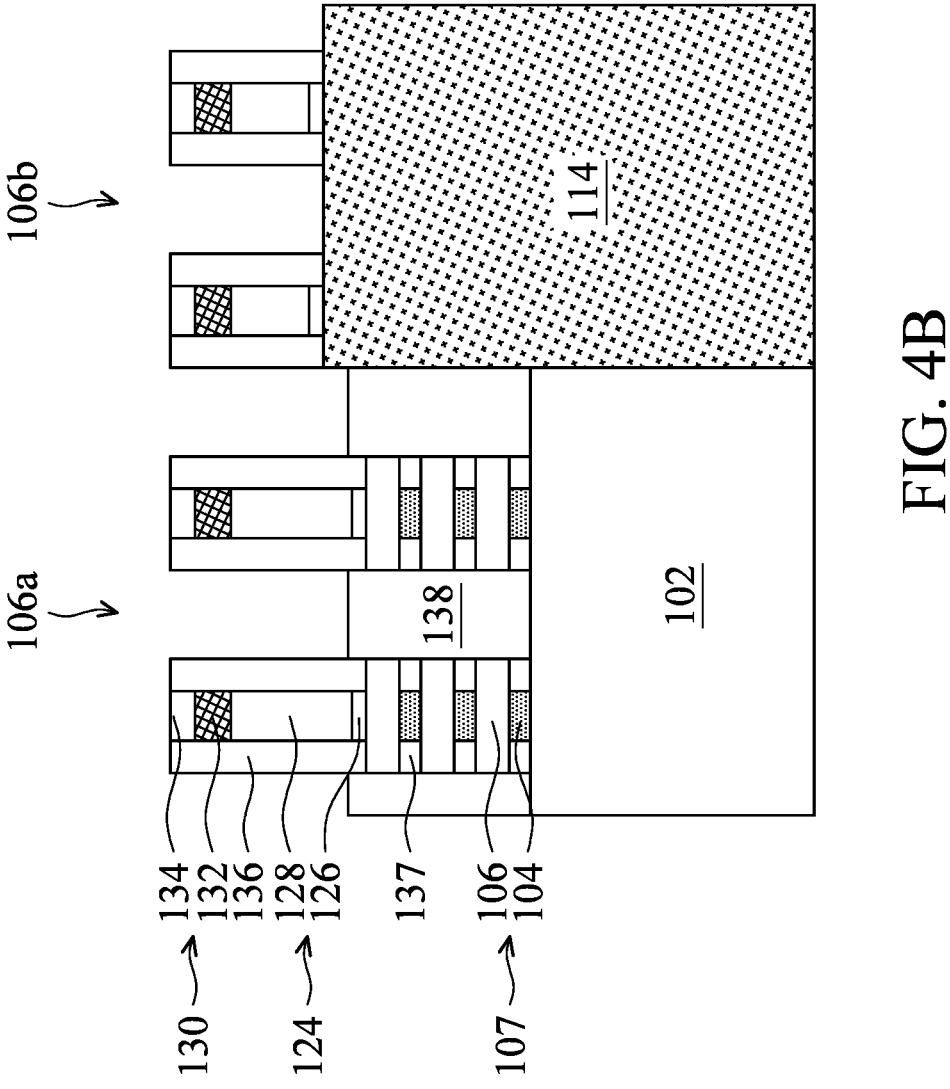

In some embodiments as shown in FIG. 4A, the dummy gate structures 124 are formed over and across the fin structures 112 and the wall structure 114. In some embodiments as shown in FIG. 4B, spacer layers 136 are formed at opposite sides of the dummy gate structures 124, and source/drain epitaxial structure 138 are formed between the semiconductor stacks 107.

The source/drain epitaxial structure 138 may include the first portion 138a, the second portion 138b, and the third portion 138c as in the previous embodiments. For the purpose of brevity, the first portion 138a, the second portion 138b, and the third portion 138c of the source/drain epitaxial structure 138 are not shown in FIG. 4B.

Figure 4C:
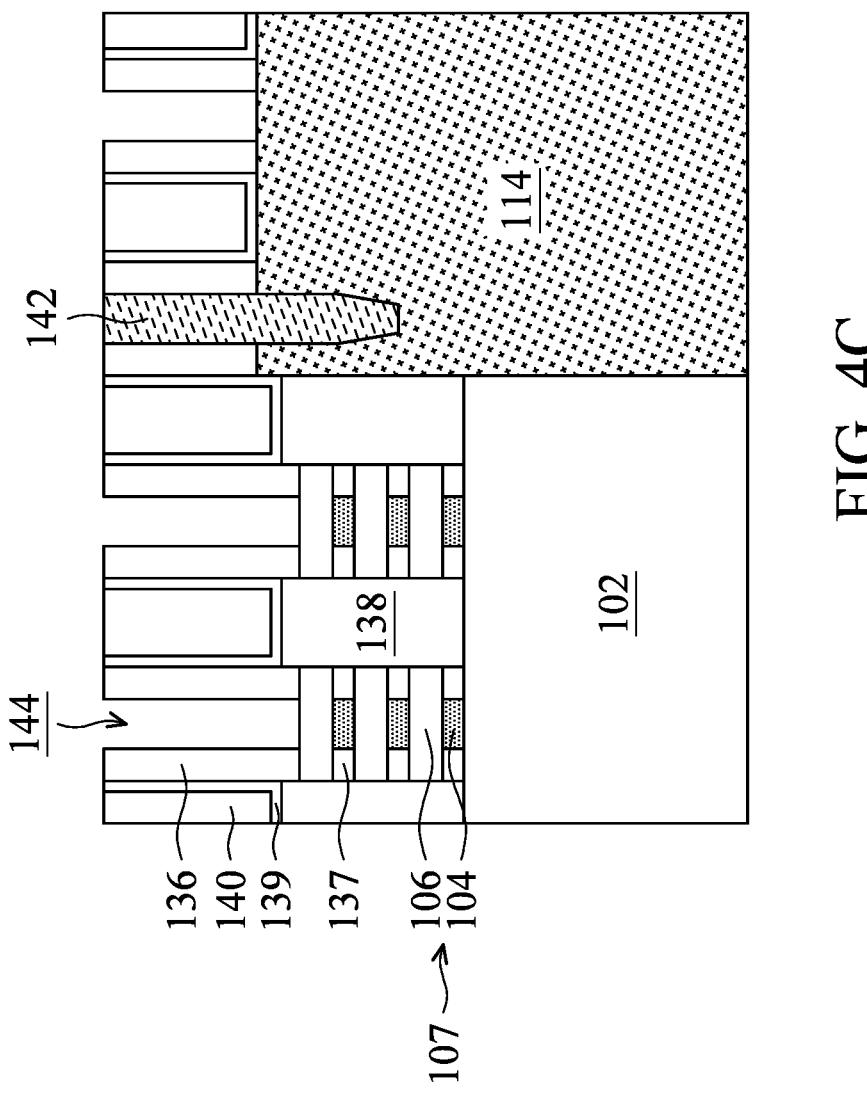

In some embodiments as shown in FIG. 4C, the dummy gate structure 124 formed over the wall structure 114 sandwiched between the nanosheet structures 106a and the forksheet structures 106b is removed, and an opening is formed. The opening may also be formed in the wall structure 114. Next, the dielectric structure 142 is formed in the opening. Afterwards, the dummy gate structures 124 are removed, and the trenches 144 are formed between spacers 136.

In some embodiments as shown in FIG. 4C, the dielectric structures 124 protrudes in the wall structure 114. In some embodiments, the bottom portion of the dielectric structures 124 is surrounded by the wall structure 114 from the cross-sectional view. In some embodiments, the wall structure 114 is in contact with the bottom surface and sidewalls of the bottom portion of the dielectric structure 124. In some embodiments, the bottom surface of the dielectric structures 124 is higher than the bottom surface of the source/drain epitaxial structure 138 and lower than the top surface of the source/drain epitaxial structure 138. In some embodiments, the bottommost surface of the dielectric structures 124 formed in the wall structure 114 is higher than the bottommost surface of the semiconductor stacks 107. In some embodiments, the bottommost surface of the dielectric structures 124 is lower than the top surface of the wall structure 114 by a depth in a range of about 50 to 60 nm.

Figure 4D:
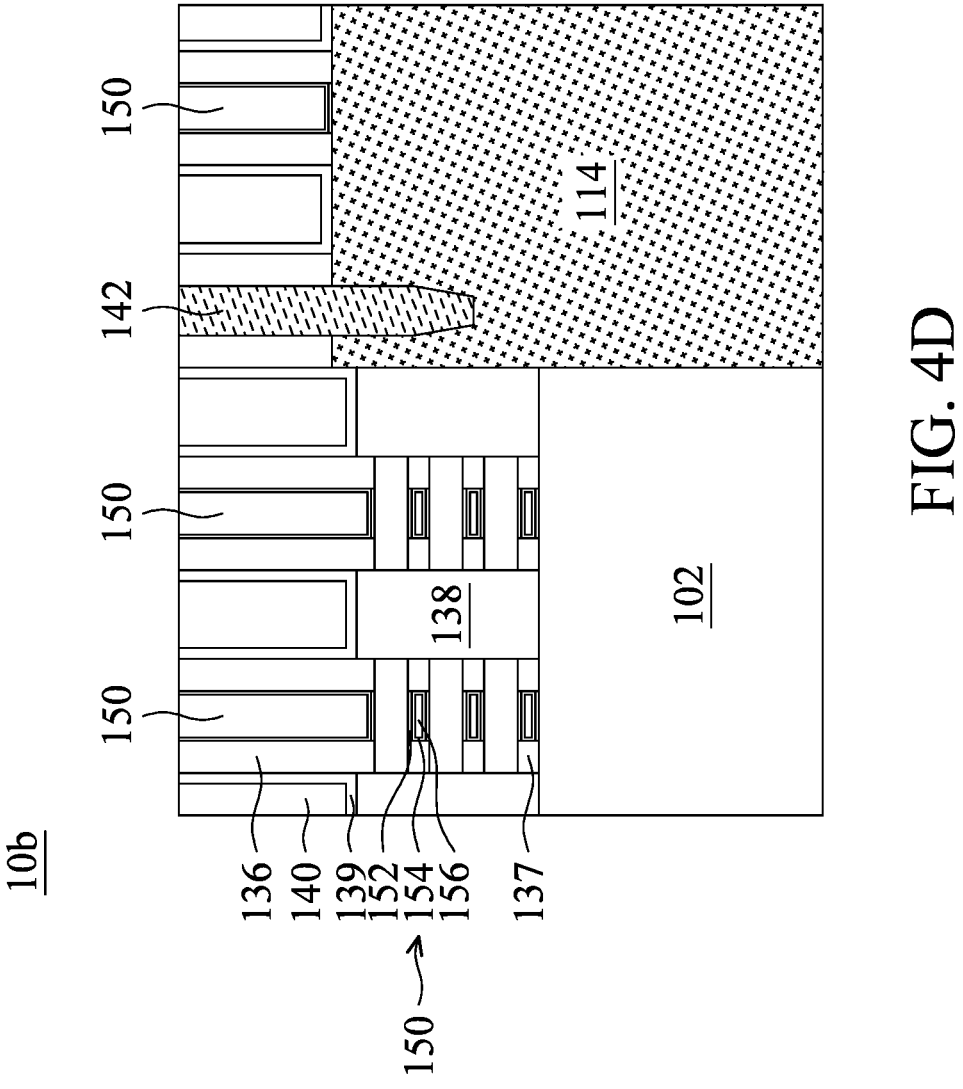

In some embodiments as shown in FIG. 4D, the first semiconductor material layers 104 are removed, and the gate structures 150 are formed in the trench 144 and surrounding the channel regions 106. The processes and materials for forming the dummy gate structure 124, the dielectric structure 142, and the gate structures 150 may be the same as, or similar to, those used to form the dummy gate structure 124, the dielectric structure 142, and the gate structures 150 in the previous embodiments. For the purpose of brevity, the descriptions of these processes and materials are not repeated herein.

With a dielectric structure 142 formed between the nanosheet structures 106a and the forksheet structures 106b, the source/drain structures 138 formed adjacent to the dielectric structure 142 may not be damaged when removing the dummy gate structure 124. Therefore, the production yield may be improved.

Figure 5:
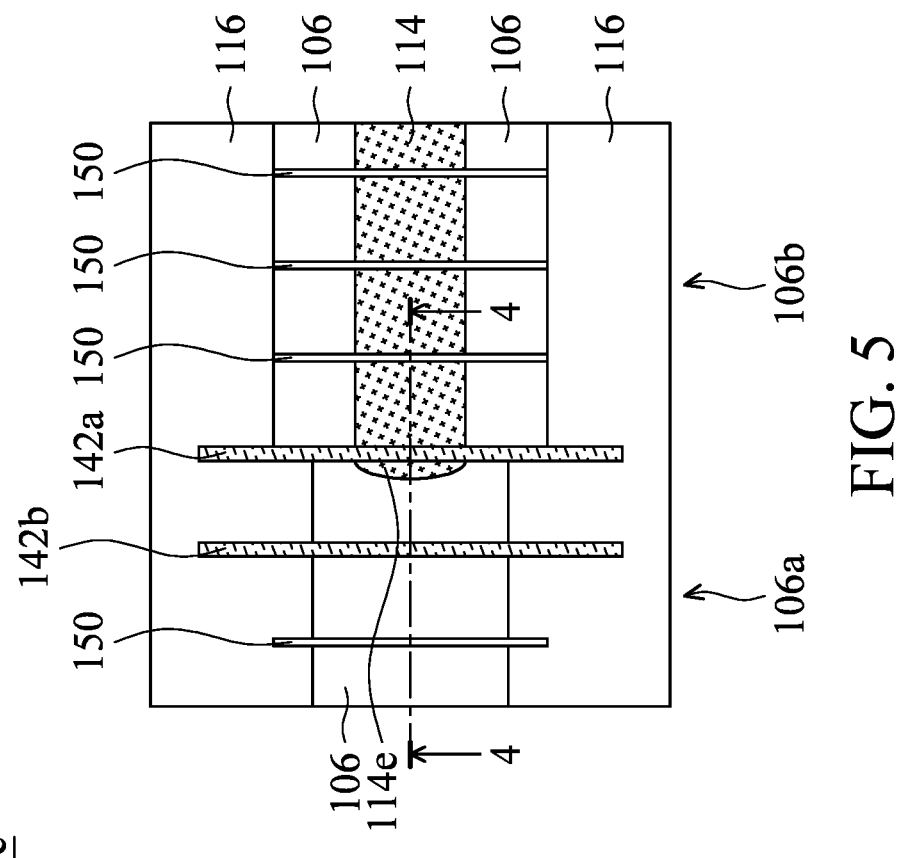
FIG. 5 is a top view of a semiconductor device structure, in accordance with some embodiments of the disclosure.

Many variations and/or modifications may be made to the embodiments of the disclosure. FIG. 5 is a top view of a semiconductor device structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5 in accordance with some embodiments, a second dielectric structure 142b is formed over the nanosheet structures 106a.

In some embodiments, the first dielectric structure 142a may be formed between the nanosheet structures 106a and the forksheet structures 106b, and the second dielectric structure 142b is formed over the nanosheet structures 106a parallel to the first dielectric structure 142a.

In some embodiments, the second dielectric structure 142b is formed between the source/drain epitaxial structures 138. The second dielectric structure 142b may provide isolation between the source/drain epitaxial structures 138.

In some embodiments, the second dielectric structure 142b is deeper than the first dielectric structure 142a. In some embodiments, the bottommost surface of the second dielectric structures 124b is lower than the topmost surface of the semiconductor stack 107 by a depth in a range of about 110 nm to about 180 nm.

With a dielectric structure 142 formed between the nanosheet structures 106a and the forksheet structures 106b, the source/drain structures 138 formed between the nano-structures 106 and the wall structure 114 may not be damaged when removing the dummy gate structure 124. Therefore, the production yield may be improved. With the second dielectric structure 142b formed over the nanosheet structures 106a, the isolation between the adjacent source/drain epitaxial structures 138 may be improved.

Figure 6:
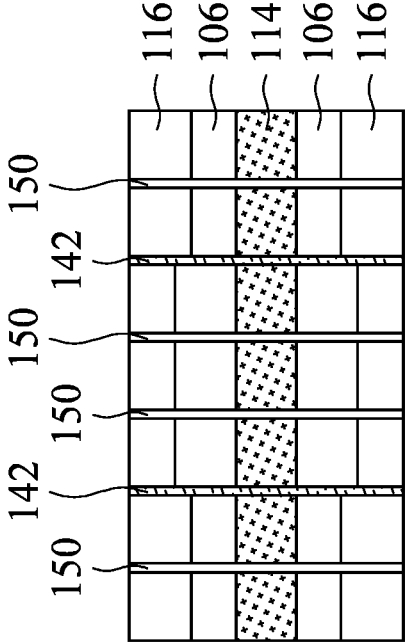
FIG. 6 is a top view of a semiconductor device structure, in accordance with some embodiments of the disclosure.
Figure 7:
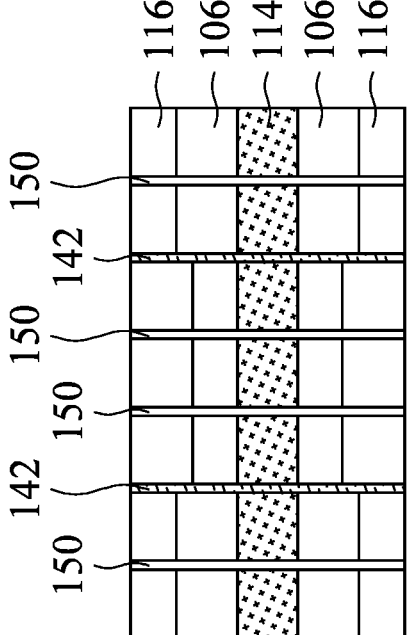
FIG. 7 is a top view of a semiconductor device structure, in accordance with some embodiments of the disclosure.

Many variations and/or modifications may be made to the embodiments of the disclosure. FIGS. 6 and 7 are top views of a semiconductor device structure 10d and 10e, respectively, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 6 and 7 in accordance with some embodiments, the nanostructures 106 of the semiconductor device structure 10d and 10e have various widths.

In some embodiments as shown in FIGS. 6 and 7, the dielectric structure 142 is formed between the nanostruc-tures 106 of different widths. Therefore, the source/drain structures 138 formed sandwiched between of nanostruc-tures 106 of different widths may not be damaged.

It should be noted that, the arrangement of the nanostruc-tures 106 shown in FIGS. 6 and 7 are merely an example, and is not limited therein. In some embodiments, the nano-structures 106 on the opposite sides of the dielectric struc-ture 142 have the same width. The nanostructures 106 may have various size and location arrangements, depending on the design demands.

With a dielectric structure 142 formed between nanostruc-tures 106 with different widths, the source/drain structures 138 formed sandwiched between nanostructures 106 with different widths may not be damaged. Therefore, the pro-duction yield may be improved. The nanostructures 106 with different widths may be arbitrary arranged.

Figure 8:
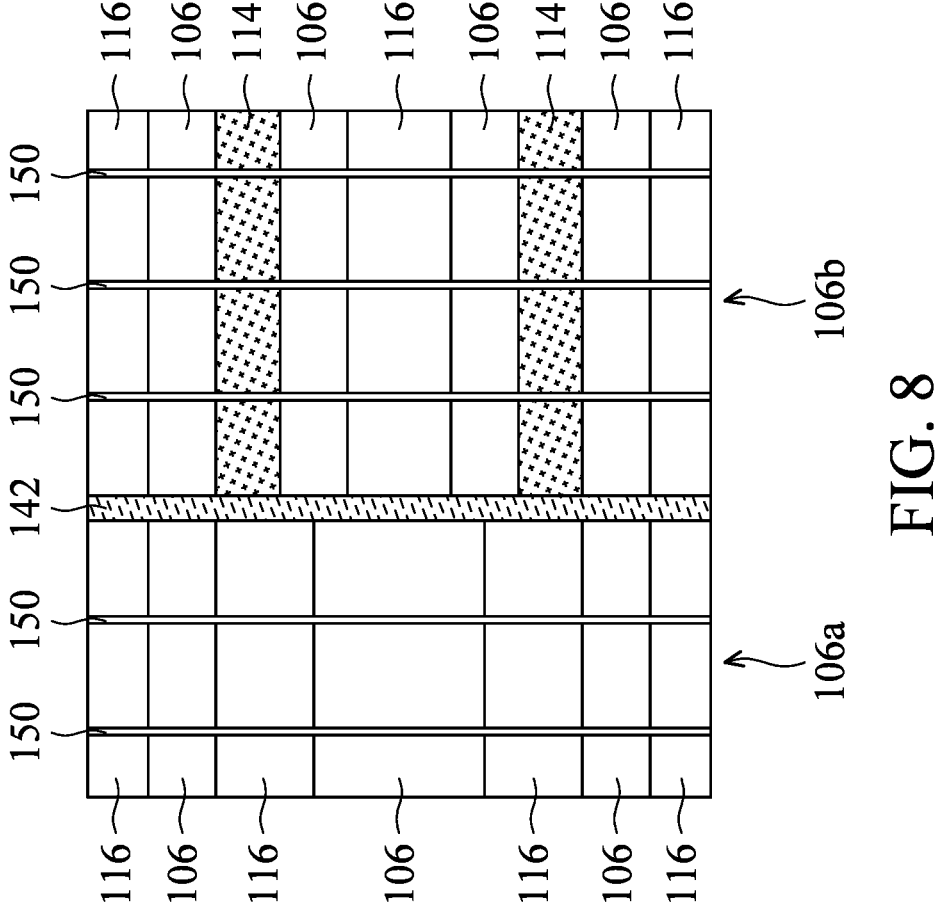
FIG. 8 is a top view of a semiconductor device structure, in accordance with some embodiments of the disclosure.

Many variations and/or modifications may be made to the embodiments of the disclosure. FIG. 8 is a top view of a semiconductor device structure 10f, in accordance with some embodiments of the disclosure. Some processes or devices are the same as, or similar to, those described in the embodiments above, and therefore the descriptions of these processes and devices are not repeated herein. The differ-ence from the embodiments described above is that, as shown in FIG. 8 in accordance with some embodiments, the nanosheet structures 106a and the forksheet structures 106b formed at opposite sides of the dielectric structures 142 are misaligned.

In some embodiments as shown in FIG. 8, the isolation structure 116 of the nanosheet structures 106a and the wall structure 114 of the forksheet structures 106b are formed at opposite sides of the dielectric structure 142. The nanosheet structures 106a may be externally connected to the forksheet structures 106b.

With a dielectric structure 142 formed between the nanosheet structures 106a and the forksheet structures 106b, the source/drain structures 138 formed adjacent to the nano-structures 106 and the wall structure 114 may not be damaged when removing the dummy gate structure 124. Therefore, the production yield may be improved. The nanosheet structures 106a and the forksheet structures 106b formed over opposite sides of the dielectric structures 142 may be misaligned.

Figure 9:
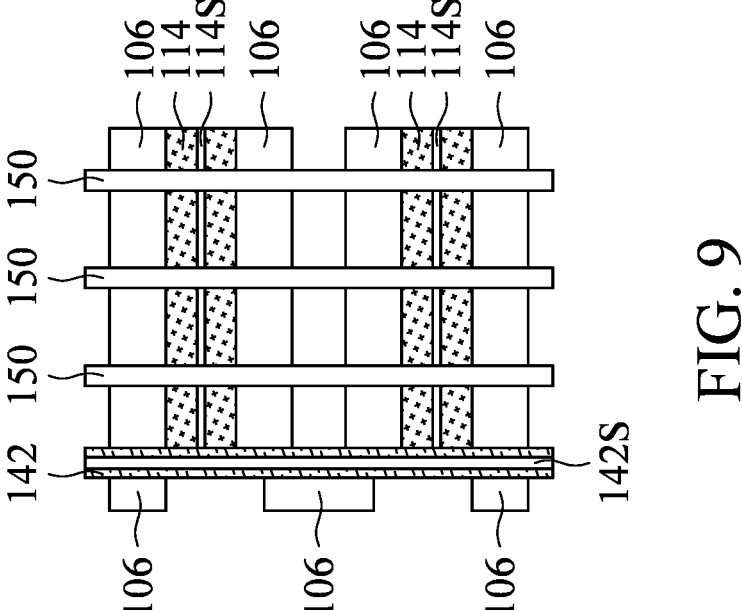
FIG. 9 is a top view of a semiconductor device structure, in accordance with some embodiments of the disclosure.

Many variations and/or modifications may be made to the embodiments of the disclosure. FIG. 9 is a top view of a semiconductor device structure 10g, in accordance with some embodiments of the disclosure. Some processes or devices are the same as, or similar to, those described in the embodiments above, and therefore the descriptions of these processes and devices are not repeated herein. The differ-ence from the embodiments described above is that, as shown in FIG. 9 in accordance with some embodiments, the seams 114S and 142S are formed in the wall structure 114 and the dielectric structure 142, respectively.

When forming the wall structure 114, the wall structure material may be conformally formed in an opening, and a seam 114S may be formed between the wall structure material formed over the sidewalls of the opening. The dielectric structure 142 may be formed later. When forming the dielectric structure 142, the dielectric structure material may be conformally formed in an opening, and a seam 142S may be formed between the dielectric structures material formed over the sidewalls of the opening.

Since the dielectric structure 142 is formed later, the dielectric structure 142 may be exposed by the seam 114S of the wall structure 114. In addition, the seam 142 of the dielectric structures 142 may be separated from the seam 114S of the wall structure 114 by the dielectric structures 142. Therefore, current leakage between the gate structure 150 and substantially formed contact structures may be prevented.

With a dielectric structure 142 formed between the nanosheet structures 106a and the forksheet structures 106b, the source/drain structures 138 sandwiched between the nanostructures 106 and the wall structure 114 may not be damaged when removing the dummy gate structure 124. Therefore, the production yield may be improved. The dielectric structure 142 and the wall structure 114 may have seams 142S and 114S, respectively.

Figure 10:
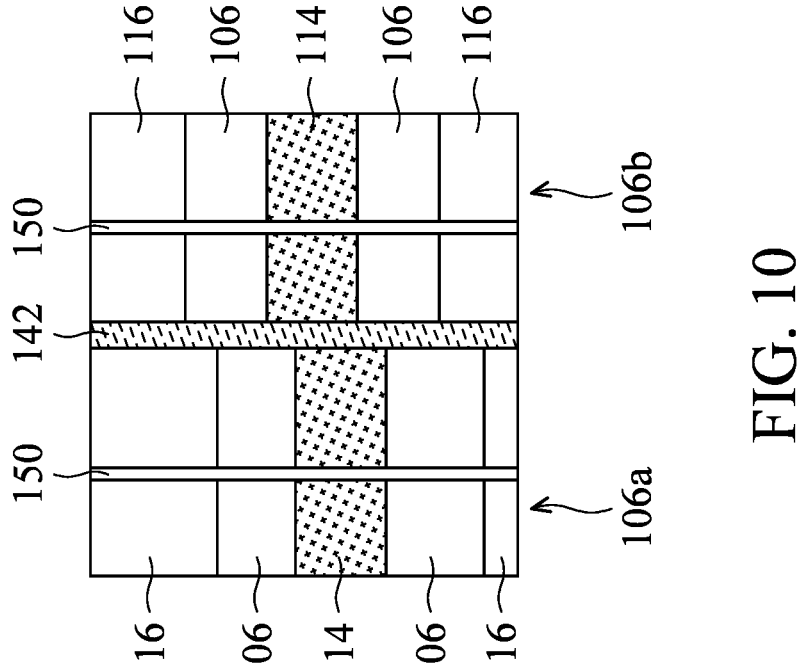
FIG. 10 is a top view of a semiconductor device structure, in accordance with some embodiments of the disclosure.

Many variations and/or modifications may be made to the embodiments of the disclosure. FIG. 10 is a top view of a semiconductor device structure 10h, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 10 in accordance with some embodiments, the wall structures 114 of the forksheet structure 106a and 106b are misaligned.

In some embodiments, the forksheet structure 106a and 106b formed at opposite sides of the dielectric structures 142 are shifted. The wall structures 114 formed at opposite sides of the dielectric structures 142 are also misaligned, depending on the design demands.

With a dielectric structure 142 formed between the forksheet structures 106a and 106b, the source/drain structures 138 formed between the nanostructures 106 and the wall structure 114 may not be damaged when removing the dummy gate structure 124. Therefore, the production yield may be improved. The forksheet structures 106a and 106b may be misaligned.

Figure 11:
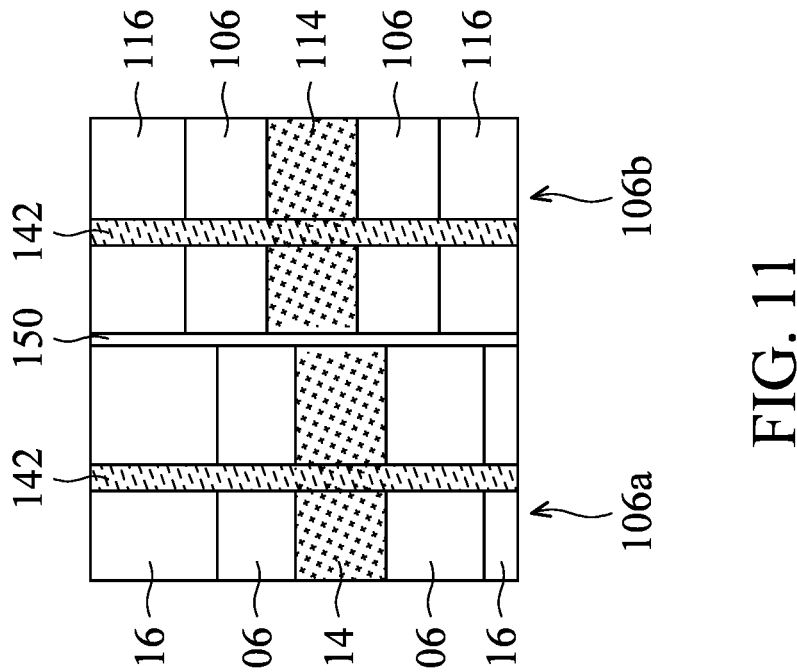
FIG. 11 is a top view of a semiconductor device structure, in accordance with some embodiments of the disclosure.

Many variations and/or modifications may be made to the embodiments of the disclosure. FIG. 11 is a top view of a semiconductor device structure 10i, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 11 in accordance with some embodiments, the gate structure 150 is formed between the forksheet structures 106a and 106b, and two dielectric structures 142 are formed at opposite sides of the gate structure 150.

The dielectric structures 142 are formed at opposite sides of the gate structure 150 may prevent the source/drain structures 138 from being damaged when removing the dummy gate structure 124 formed between the forksheet structures 106a and 106b.

With dielectric structures 142 formed over opposite sides of the dummy gate structure 124 between the forksheet structures 106a and 106b, the source/drain structures 138 formed outside the region defined by the dielectric structures 142 may not be damaged when removing the dummy gate structure 124. Therefore, the production yield may be improved.

Figure 12:
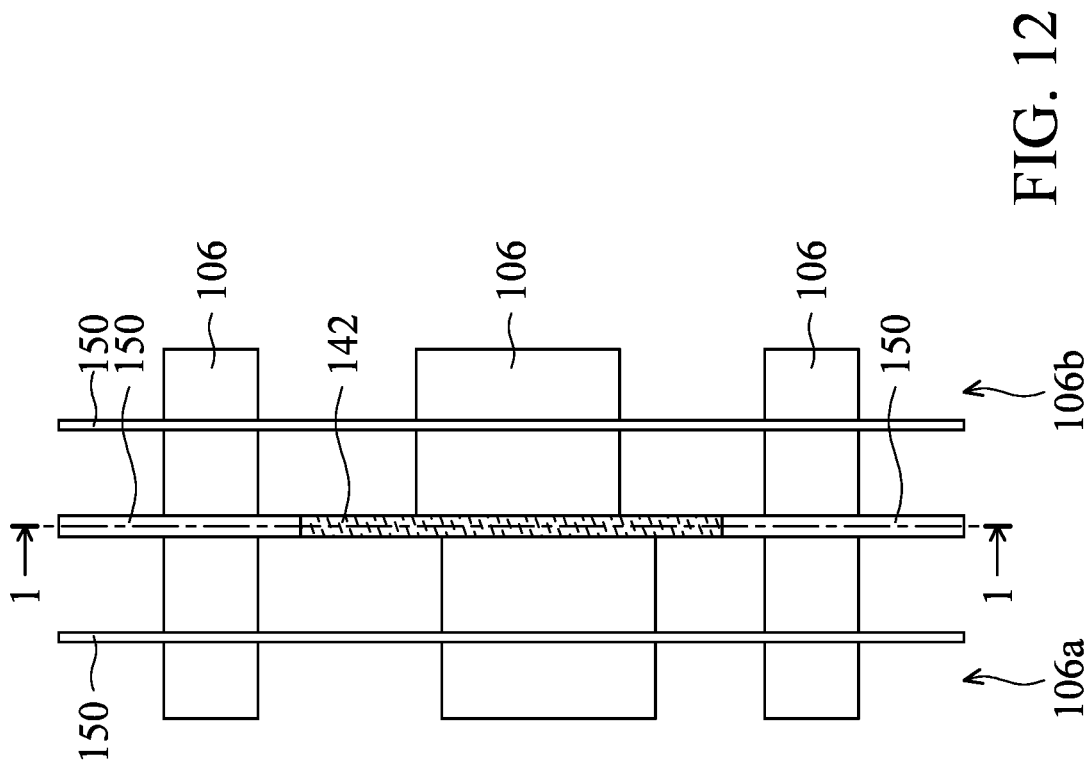
FIG. 12 is a top view of a semiconductor device structure, in accordance with some embodiments of the disclosure.
Figures 1, 12:
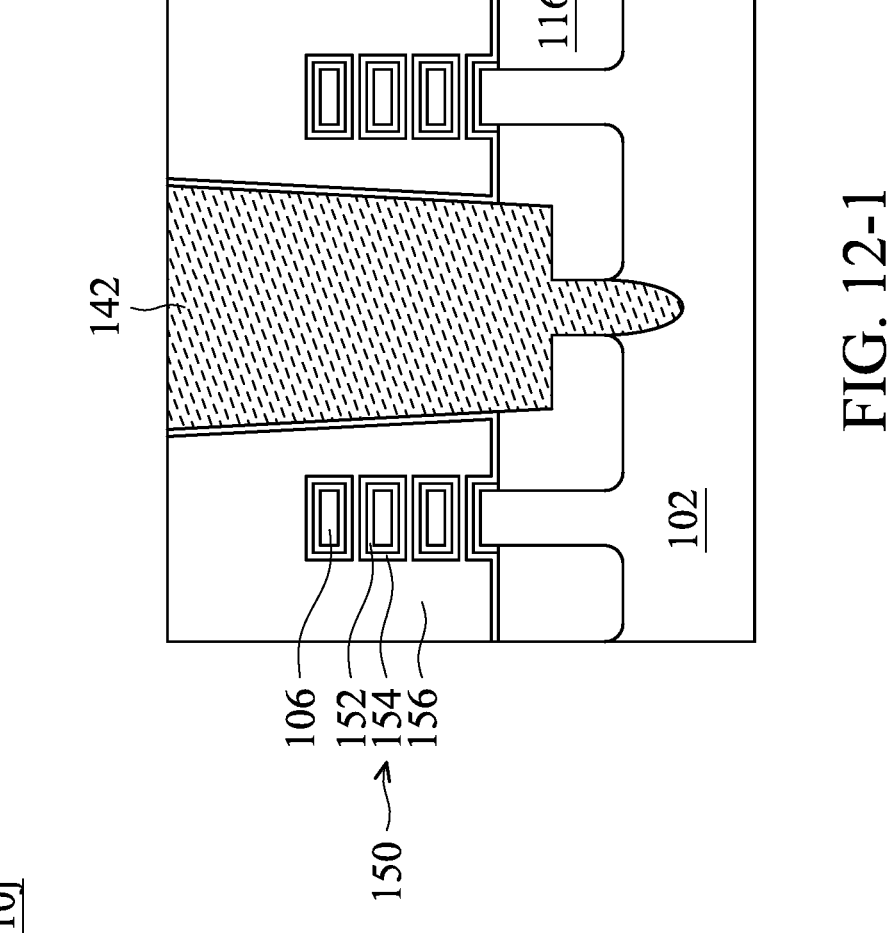

Many variations and/or modifications may be made to the embodiments of the disclosure. FIG. 12 is a top view of a semiconductor device structure 10j, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 12 in accordance with some embodiments, the nanosheet structures 106a and 106b are misaligned.

The nanosheet structures 106a and 106b formed at opposite sides of the dielectric structures 142 may be both nanosheet structures 106a and 106b. The sidewalls of the nanosheet structures 106a and 106b may be shifted, depending on the design demands.

FIG. 12-1 shows cross-sectional representations taken along line 1-1 in FIG. 12. The nanostructures 106 formed between the nanosheet structures 106a and 106b is fully replaced by the dielectric structure 142. The dielectric structure 142 may have an extending portion protruding towards the substrate 102. The extending portion of the dielectric structure 142 may be formed between the isolation structures 116.

With a dielectric structure 142 formed between the nanosheet structures 106a and 106b, the source/drain structures 138 formed adjacent to the nanosheet structures 106a and 106b may not be damaged when removing the dummy gate structure 124. Therefore, the production yield may be improved. The nanosheet structures 106a and 106b may be misaligned.

Figure 13:
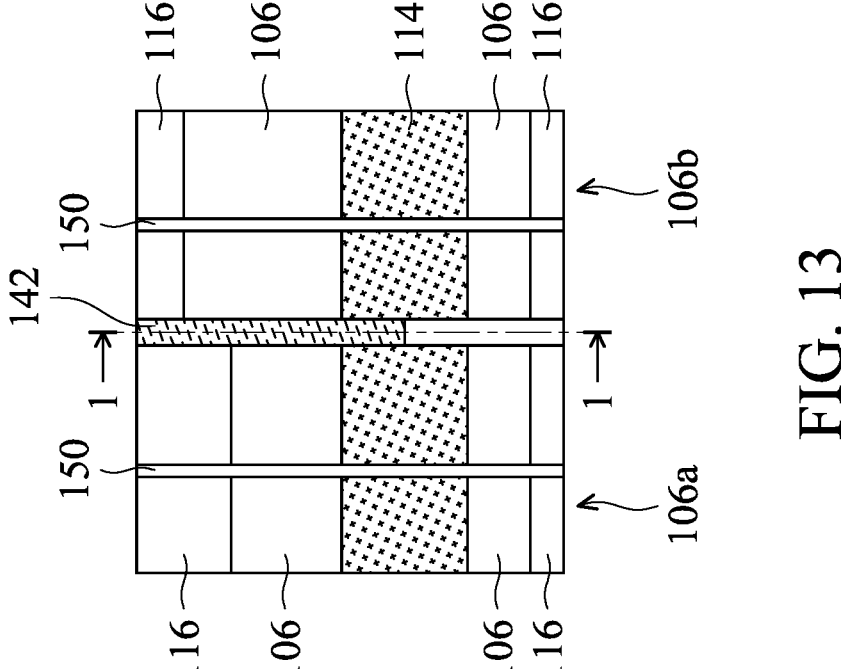
FIG. 13 is a top view of a semiconductor device structure, in accordance with some embodiments of the disclosure.
Figures 1, 13:
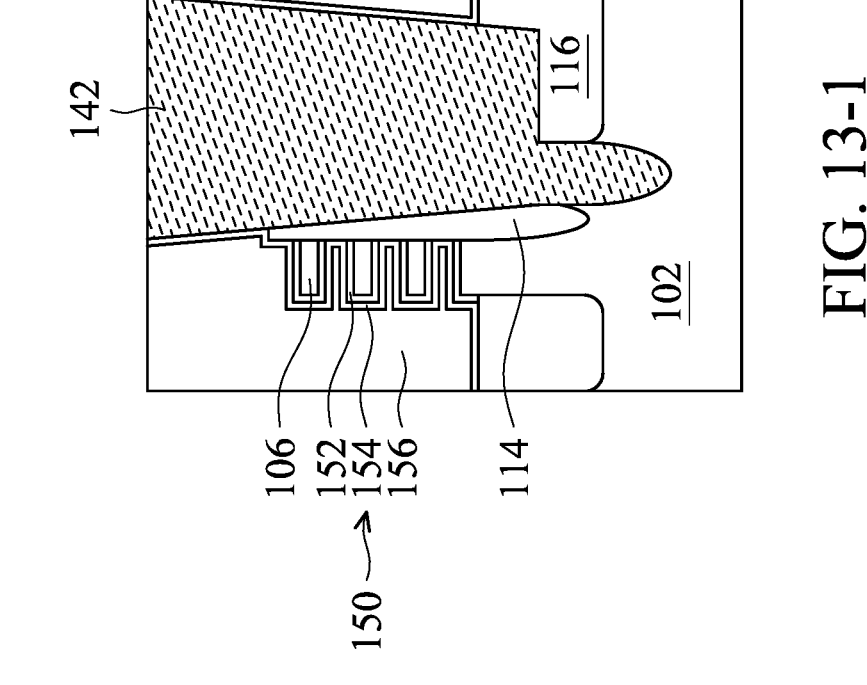

Many variations and/or modifications may be made to the embodiments of the disclosure. FIG. 13 is a top view of a semiconductor device structure 10k, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 13 in accordance with some embodiments, the dielectric structure 142 partially overlaps the wall structure 114.

In some embodiments, the forksheet structures 106a and 106b may share the same input or output terminal. Therefore, a portion of the nanostructures 106 of the forksheet structures 106a and 106b may electrically connected with each other. The dielectric structure 142 only partially overlaps the wall structure 114.

FIG. 13-1 shows cross-sectional representations taken along line 1-1 in FIG. 13. The nanostructures 106 formed between the nanosheet structures 106a and 106b is partially replaced by the dielectric structure 142. In some embodiments, the gate dielectric layer 154 is conformally formed over sidewalls of the dielectric structure 142 and the wall structure 114. The dielectric structure 142 may have an extending portion protruding towards the substrate 102. The extending portion of the dielectric structure 142 may be formed between the isolation structure 116 and the wall structure 114.

With a dielectric structure 142 formed between the forksheet structures 106a and 106b, the source/drain structures 138 formed between the forksheet structures 106a and 106b may not be damaged when removing the dummy gate structure 124. Therefore, the production yield may be improved. The dielectric structure 142 may be partially covering the wall structure 114.

Figure 14:
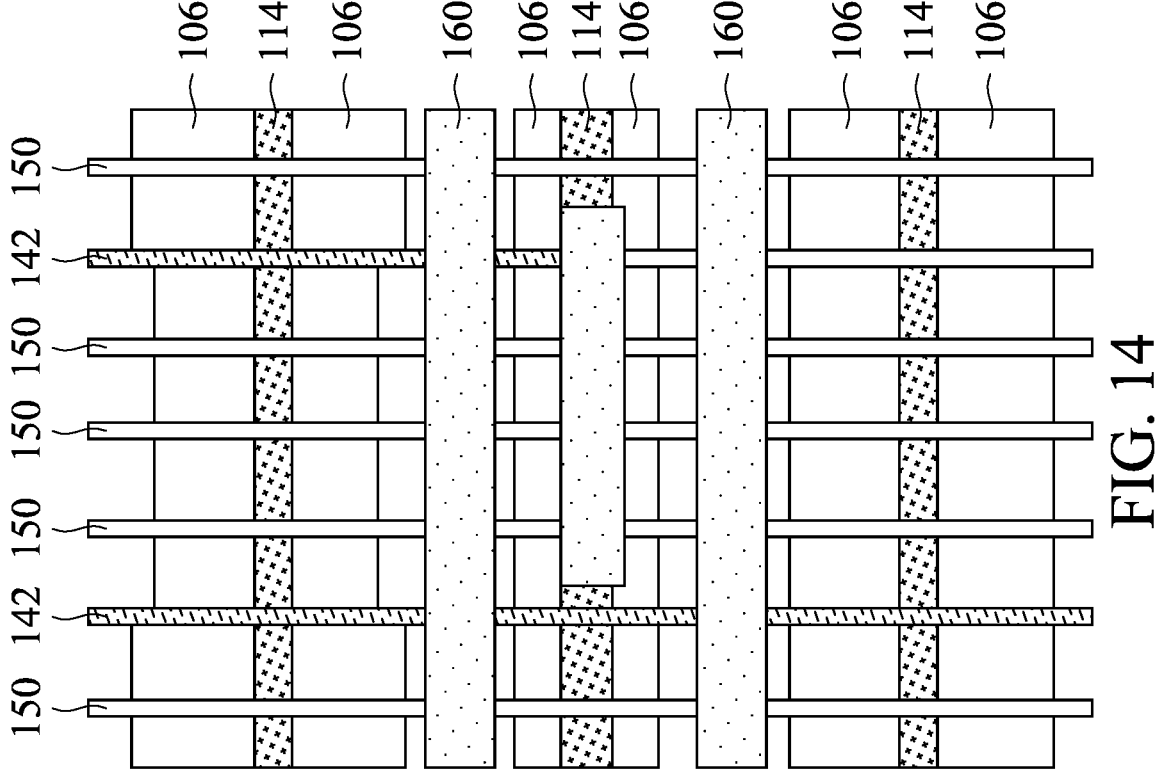
FIG. 14 is a top view of a semiconductor device structure, in accordance with some embodiments of the disclosure.

Many variations and/or modifications may be made to the embodiments of the disclosure. FIG. 14 is a top view of a semiconductor device structure 10l, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 14 in accordance with some embodiments, a blocking structure 160 may cut off the gate structure 150 and the dielectric structures 142.

The blocking structure 160 may be landed on the isolation structure 116 to separate gate structure 150. The blocking structure 160 may be extended in the wall structure 114. In some embodiments, the bottom surface of the blocking structure 160 formed in the wall structure 114 is higher than the bottom surface of the blocking structure 160 formed over the isolation structure 116. The blocking structure 160 may be formed between the dielectric structure 142 and the gate structure 150. The blocking structure 160 may include SiN, SiCN, SiOC, SiOCN other suitable materials, or a combination thereof. The blocking structure 160 may be formed using CVD, ALD, other applicable methods, or a combination thereof.

With a dielectric structure 142 formed between nanostructures 106 with different widths, the source/drain structures 138 formed sandwiched between nanostructures 106 with different widths may not be damaged. Therefore, the production yield may be improved. The dielectric structure 142 may be cut off by the blocking structure 160.

As described previously, a dielectric structure 142 is formed between nanostructures 106 with shifted sidewalls. With the dielectric structure 142, the source/drain structures 138 formed adjacent to the dielectric structure 142 may not be damaged when removing the dummy gate structure 124. In some embodiments as shown in FIG. 1, the dummy gate structure 124 is fully replaced by the dielectric structure 142. In some embodiments as shown in FIG. 3, the dielectric structure 142 is formed between the nanosheet structures 106a and the forksheet structure 106b with misaligned sidewalls. In some embodiments as shown in FIG. 5, a second dielectric structure 142b is formed over the nanostructures 106 parallel to the first dielectric structure 142a, providing isolation between the source/drain structures 138. In some embodiments as shown in FIGS. 6 and 7, nanostructures 106 with various widths are arranged. In some embodiments as shown in FIG. 8, the nanosheet structures 106a and the forksheet structure 106b formed over opposite sides of the dielectric structure 142 are misaligned. In some embodiments as shown in FIG. 9, the seams 114S and 142S are formed in the wall structure 114 and the dielectric structure 142, respectively. In some embodiments as shown in FIG. 10, the wall structures 114 formed at opposite sides of the dielectric structure 142 are misaligned. In some embodiments as shown in FIG. 11, the gate structure 150 is formed between the misaligned forksheet structures 106a and 106b, and two dielectric structures 142 are formed at opposite sides of the gate structures. In some embodiments as shown in FIG. 12, the nanosheet structures 106a and 106b formed over opposite sides of the dielectric structure 142 are misaligned. In some embodiments as shown in FIG. 13, the dielectric structure 142 partially overlaps the wall structure 114. In some embodiments as shown in FIG. 14, the dielectric structure 142 may be cut off by a blocking structure 160.

Embodiments of a semiconductor device structure and a method for forming the same are provided. A dielectric structure is formed between nanostructures of different widths. The dielectric structure may prevent adjacent source/drain structures from being damaged, and the production yield may be improved.

In some embodiments, a semiconductor device structure is provided. The semiconductor device structure includes first nanostructures and second nanostructures formed over a substrate. The semiconductor device structure also includes gate structures that are wrapped around the first nanostructures and the second nanostructures and that extend along a first direction. The semiconductor device structure also includes a dielectric structure formed between two of the gate structures and parallel to the gate structures. A first sidewall of the first nanostructures is misaligned with a first sidewall of the second nanostructures in a second direction, and the second direction is different from the first direction.

In some embodiments, a semiconductor device structure is also provided. The semiconductor device structure includes a wall structure formed over a substrate. The semiconductor device structure also includes first nanostructures attached to a first sidewall of the wall structure. The semiconductor device structure also includes second nanostructures formed parallel to the first nanostructures. The semiconductor device structure also includes third nanostructures formed parallel to the first nanostructures and the second nanostructures and attached to a second sidewall of the wall structure. The semiconductor device structure also includes a dielectric structure sandwiched between the first nanostructure and the second nanostructures. The semiconductor device structure also includes gate structures formed across the first nanostructures and the second nanostructures. The first nanostructures and the second nanostructures have different widths.

In some embodiments, a method for forming a semiconductor device structure is provided. The method for forming a semiconductor device structure includes forming first nanostructures and second nanostructures over a substrate. The method for forming a semiconductor device structure also includes forming dummy gate structures across the first nanostructures and the second nanostructures. The method for forming a semiconductor device structure also includes forming source/drain structures between dummy gate structures. The method for forming a semiconductor device structure also includes forming an interlayer dielectric structure over the source/drain structures. The method for forming a semiconductor device structure also includes removing at least one of the dummy gate structures to form an opening sandwiched between the first nanostructures and the second nanostructures. The method for forming a semiconductor device structure also includes removing the first nanostructures and the second nanostructures directly under the opening. The method for forming a semiconductor device structure also includes filling a dielectric material to form a dielectric structure in the opening. A portion of the dielectric structure is between the source/drain structure and the interlayer dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   first nanostructures and second nanostructures formed over a substrate;
   gate structures wrapped around the first nanostructures and the second nanostructures and extending along a first direction; and
   a dielectric structure formed between two of the gate structures and parallel to the gate structures,
   wherein a first sidewall of the first nanostructures is shifted from a first sidewall of the second nanostructures in a second direction, and wherein the second direction is different from the first direction.

2. The semiconductor device structure as claimed in claim 1, wherein the dielectric structure is sandwiched between the first nanostructures and the second nanostructures.

3. The semiconductor device structure as claimed in claim 1, further comprising:

a wall structure formed beside the first nanostructures, wherein the dielectric structure is formed across the wall structure.

4. The semiconductor device structure as claimed in claim 3, wherein the wall structure is in contact with a bottom surface and sidewalls of a bottom portion of the dielectric structure.

5. The semiconductor device structure as claimed in claim 3, wherein the wall structure protrudes from a third sidewall of the second nanostructures in the first direction in a top view.

6. The semiconductor device structure as claimed in claim 3, further comprising:

a second dielectric structure parallel to the dielectric structure formed across the second nanostructures.

7. The semiconductor device structure as claimed in claim 6, wherein one of the gate structures is formed between the dielectric structure and the second dielectric structure.

8. The semiconductor device structure as claimed in claim 3, further comprising:

a second wall structure formed beside the second nano-structures, wherein the second wall structure is shifted from the wall structure.

9. A semiconductor device structure, comprising:

a wall structure formed over a substrate;

first nanostructures attached to a first sidewall of the wall structure;

second nanostructures formed parallel to the first nano-structures;

third nanostructures formed parallel to the first nanostruc-tures and the second nanostructures and attached to a second sidewall of the wall structure;

a dielectric structure sandwiched between the first nano-structures and the second nanostructures; and gate structures formed across the first nanostructures and the second nanostructures, wherein the first nanostructures and the second nanostruc-tures have different widths.

10. The semiconductor device structure as claimed in claim 9, further comprising:

an isolation structure formed beside the second nanostruc-tures, wherein the wall structure and the isolation structure are at opposite sides of the dielectric structure.

11. The semiconductor device structure as claimed in claim 9, further comprising:

a first seam formed in the wall structure, wherein a portion of the dielectric structure is exposed by the first seam.

12. The semiconductor device structure as claimed in claim 11, further comprising:

a second seam formed in the dielectric structure, wherein the second seam is separated from the first seam.

13. The semiconductor device structure as claimed in claim 9, wherein the dielectric structure partially overlaps the wall structure.

14. The semiconductor device structure as claimed in claim 9, further comprising:

source/drain structures formed at opposite sides of the gate structures; and a dummy gate material formed between the source/drain structures and the dielectric structure.

15. The semiconductor device structure as claimed in claim 9, wherein a bottom surface of the dielectric structure is lower than a top surface of the wall structure.

16. A semiconductor device structure, comprising:

an isolation structure surrounding a substrate;

first nanostructures and second nanostructures over the substrate;

gate structures wrapped around the first nanostructures and the second nanostructures;

a dielectric structure between the first nanostructures and the second nanostructures, wherein a lower portion of the dielectric structure extends into the isolation struc-ture; and a wall structure attached to the first nanostructures, wherein the wall structure is at opposite sides of the dielectric structure.

17. The semiconductor device structure as claimed in claim 16, wherein a bottom width of the dielectric structure is less than a top width of the dielectric structure.

18. The semiconductor device structure as claimed in claim 16, wherein an area of the wall structure on a first side of the dielectric structure is greater than an area of the wall structure on a second side of the dielectric structure opposite to the first side in a top view.

19. The semiconductor device structure as claimed in claim 16, wherein the first nanostructures and the second nanostructures have different widths.

20. The semiconductor device structure as claimed in claim 16, wherein the lower portion of the dielectric struc-ture has a tapered width.

* * * * *